(12) United States Patent
Li et al.

(10) Patent No.: US 11,715,674 B2
(45) Date of Patent: *Aug. 1, 2023

(54) TRIM WALL PROTECTION METHOD FOR MULTI-WAFER STACKING

(71) Applicant: Taiwan Semiconductor Manufacturing Company, Ltd., Hsin-Chu (TW)

(72) Inventors: Sheng-Chan Li, Tainan (TW); Cheng-Hsien Chou, Tainan (TW); Sheng-Chau Chen, Tainan (TW); Cheng-Yuan Tsai, Chu-Pei (TW); Kuo-Ming Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/501,418

(22) Filed: Oct. 14, 2021

(65) Prior Publication Data

US 2022/0068745 A1 Mar. 3, 2022

Related U.S. Application Data

(63) Continuation of application No. 16/785,866, filed on Feb. 10, 2020, now Pat. No. 11,152,276.

(51) Int. Cl.
*H01L 21/00* (2006.01)
*H01L 23/31* (2006.01)
(Continued)

(52) U.S. Cl.
CPC .......... *H01L 23/3185* (2013.01); *H01L 21/56* (2013.01); *H01L 21/76829* (2013.01);
(Continued)

(58) Field of Classification Search
CPC ............... H01L 23/3185; H01L 23/481; H01L 23/5283; H01L 25/0657; H01L 21/56; H01L 21/76829
See application file for complete search history.

(56) References Cited

U.S. PATENT DOCUMENTS 6,051,477 A   4/2000 Nam
8,765,578 B2   7/2014 La Tulipe, Jr. et al.
(Continued)

FOREIGN PATENT DOCUMENTS

JP   2018182146 A   11/2018

OTHER PUBLICATIONS

Axus Technology. "Wafer Edge Trimming Process Application Note" Published May 2013.
(Continued)

*Primary Examiner* — Nicholas J Tobergte
(74) *Attorney, Agent, or Firm* — Eschweiler & Potashnik, LLC

(57) ABSTRACT

The present disclosure, in some embodiments, relates to an integrated chip structure. The integrated chip structure includes a first substrate having an upper surface and a recessed surface extending in a closed loop around the upper surface. The recessed surface is vertically between the upper surface and a lower surface of the first substrate opposing the upper surface. A first plurality of interconnects are disposed within a first dielectric structure on the upper surface. A dielectric protection layer is over the recessed surface, along a sidewall of the first dielectric structure, and along a sidewall of the first substrate. The first substrate extends from directly below the dielectric protection layer to laterally outside of the dielectric protection layer.

20 Claims, 29 Drawing Sheets

Related U.S. Application Data

(60) Provisional application No. 62/928,497, filed on Oct. 31, 2019.

(51) Int. Cl.
    *H01L 21/56*     (2006.01)
    *H01L 21/768*     (2006.01)
    *H01L 23/48*     (2006.01)
    *H01L 23/528*     (2006.01)
    *H01L 25/065*     (2023.01)

(52) U.S. Cl.
    CPC ........ *H01L 23/481* (2013.01); *H01L 23/5283* (2013.01); *H01L 25/0657* (2013.01)

(56) References Cited

U.S. PATENT DOCUMENTS

| | | |
|---|---|---|
| 8,841,201 B2 | 9/2014 | Teng et al. |
| 9,224,696 B2 | 12/2015 | Li et al. |
| 10,921,233 B2 | 2/2021 | Rival et al. |
| 11,152,276 B2 * | 10/2021 | Li .................... H01L 23/5283 |
| 2013/0328174 A1 | 12/2013 | La Tulipe, Jr. et al. |
| 2015/0035166 A1 | 2/2015 | Letterman, Jr. et al. |
| 2020/0163223 A1 | 5/2020 | Mok et al. |

OTHER PUBLICATIONS

Non-Final Office Action dated Mar. 2, 2021 for U.S. Appl. No. 16/785,866.

Notice of Allowance dated Jun. 17, 2021 for U.S. Appl. No. 16/785,866.

\* cited by examiner

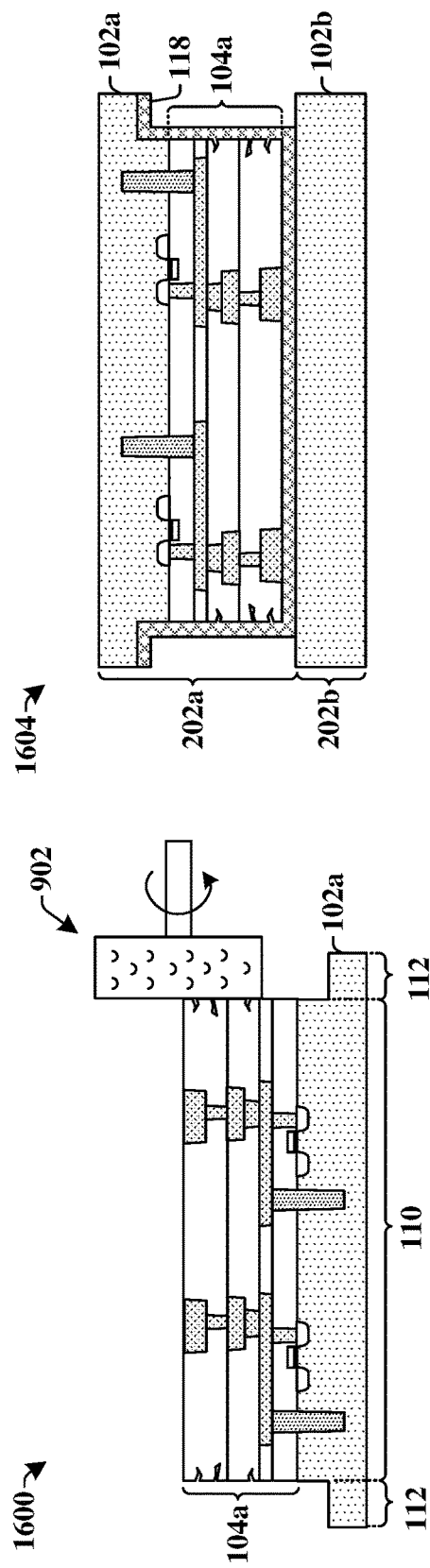
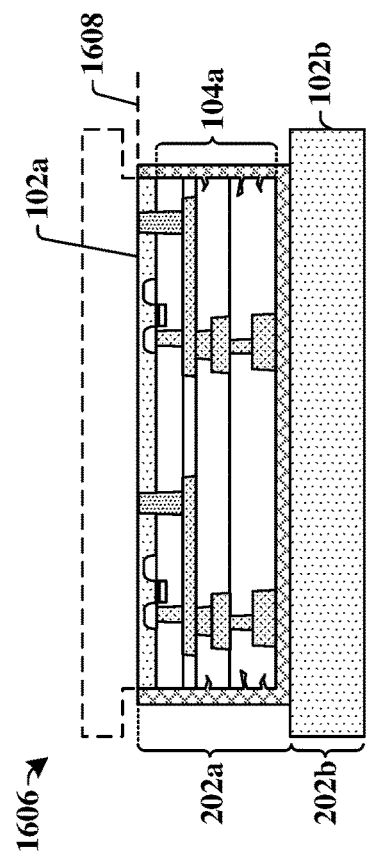
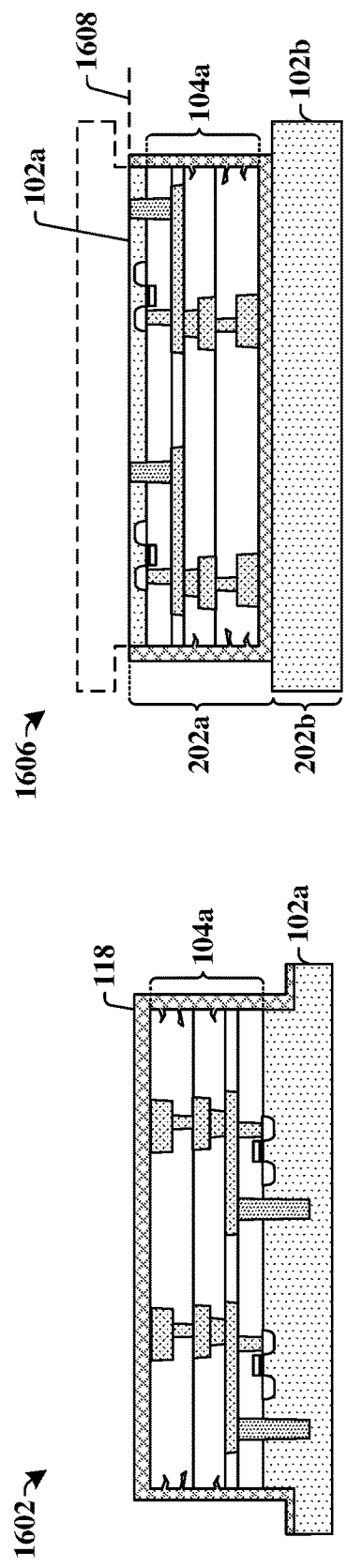
Fig. 16A
Fig. 16B
Fig. 16C
Fig. 16D

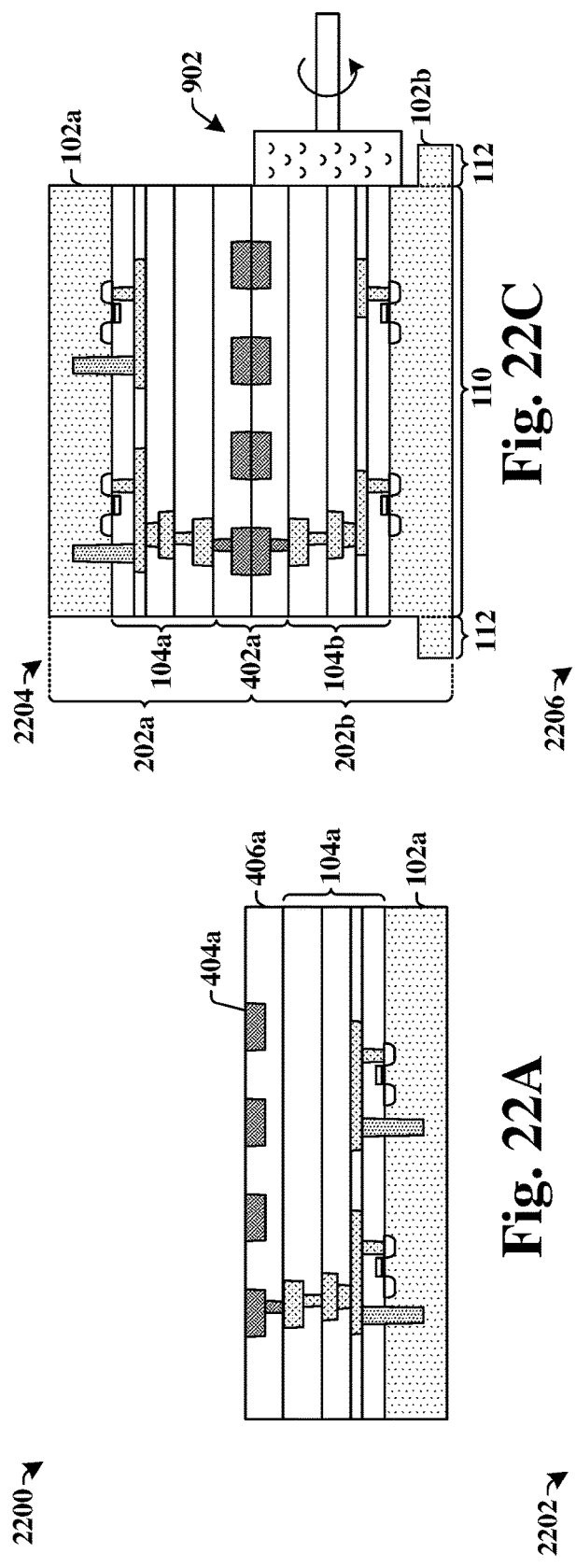
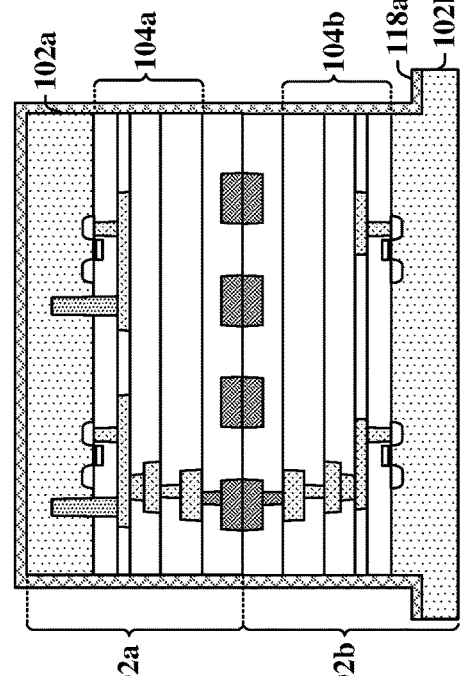
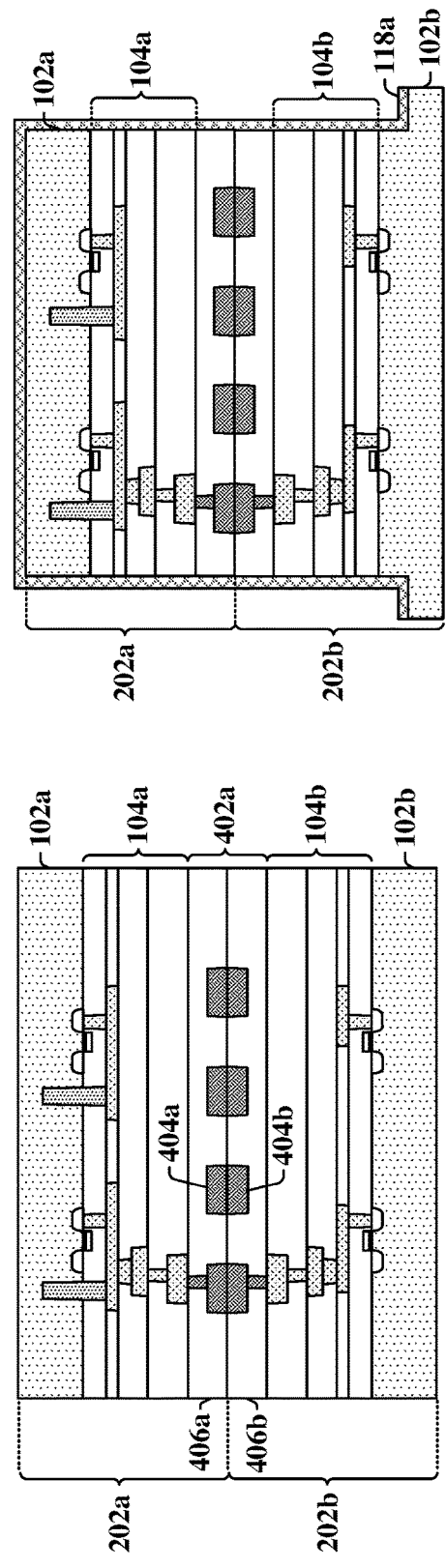
Fig. 22A
Fig. 22B
Fig. 22C
Fig. 22D

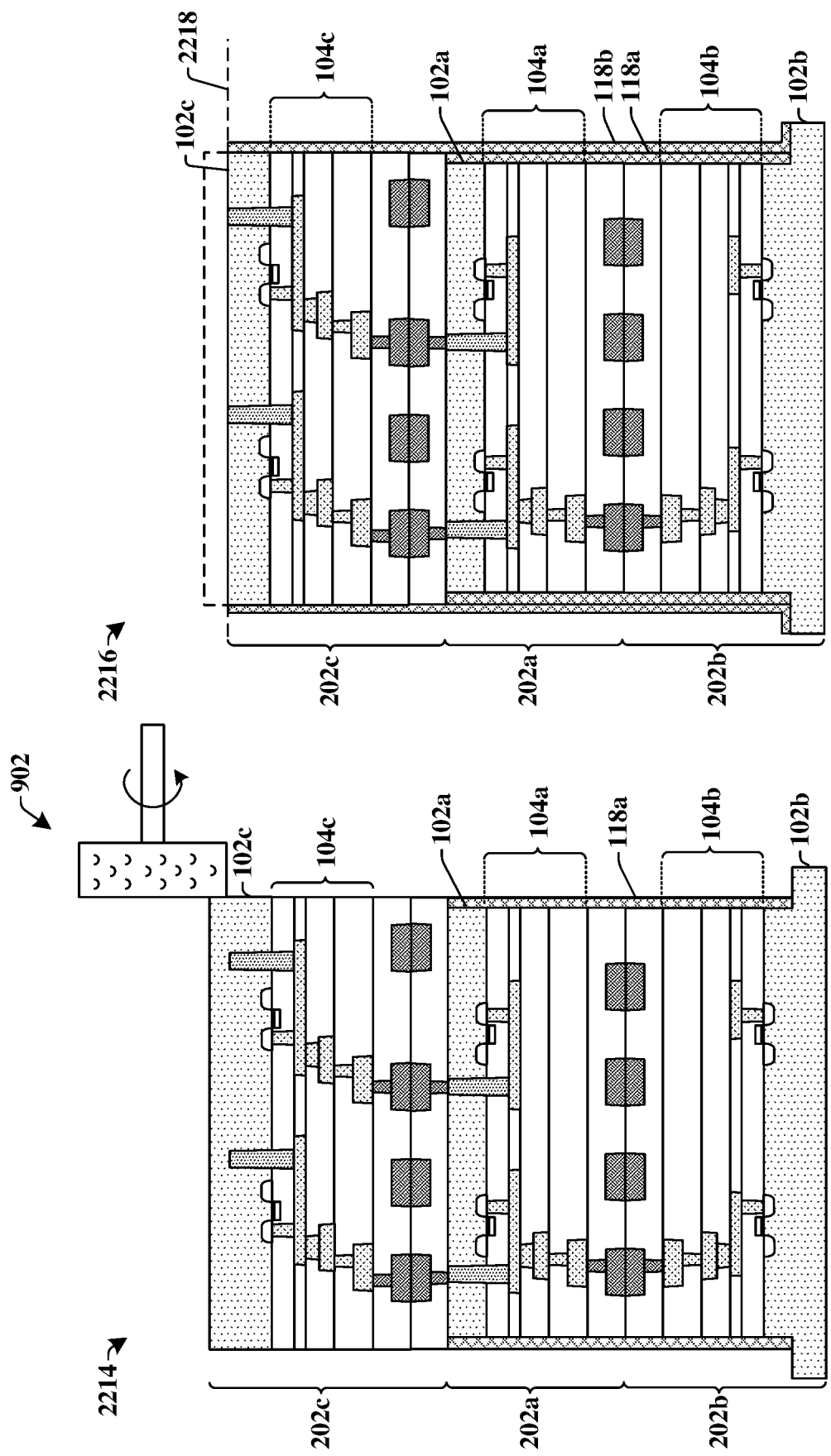

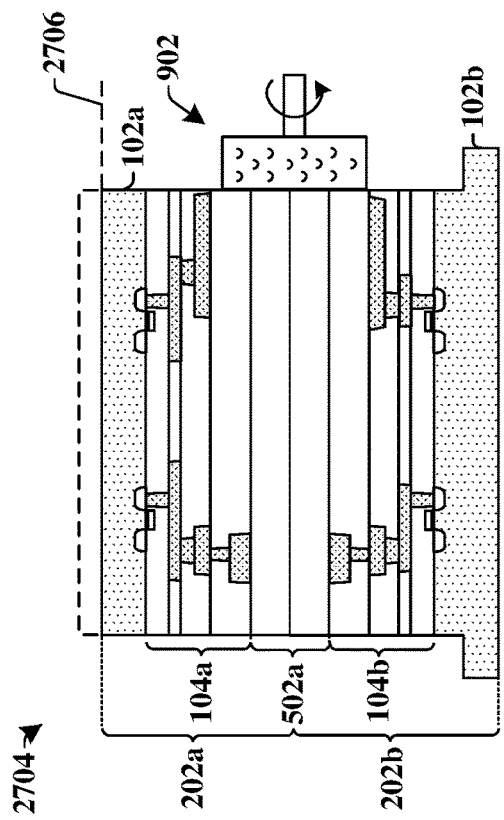
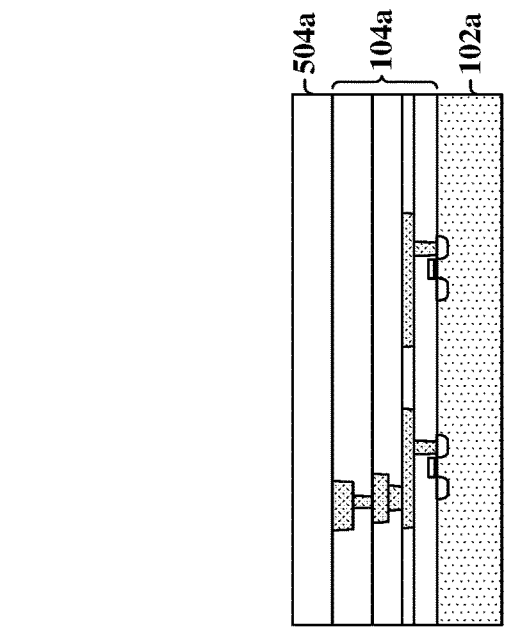
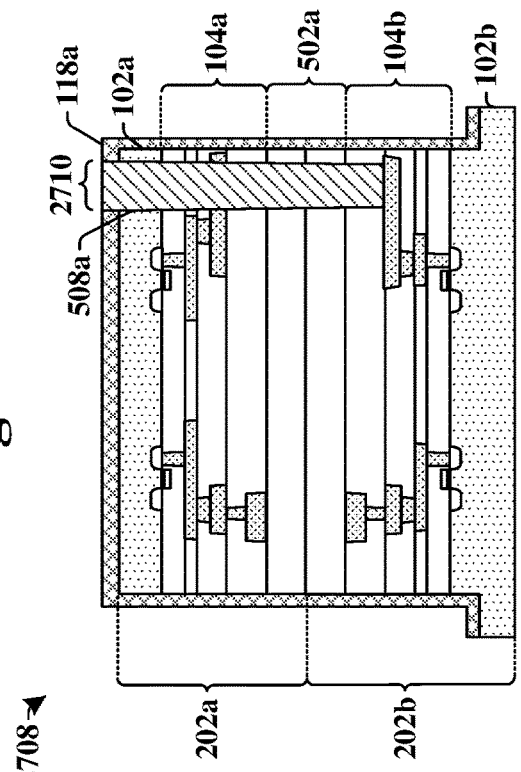
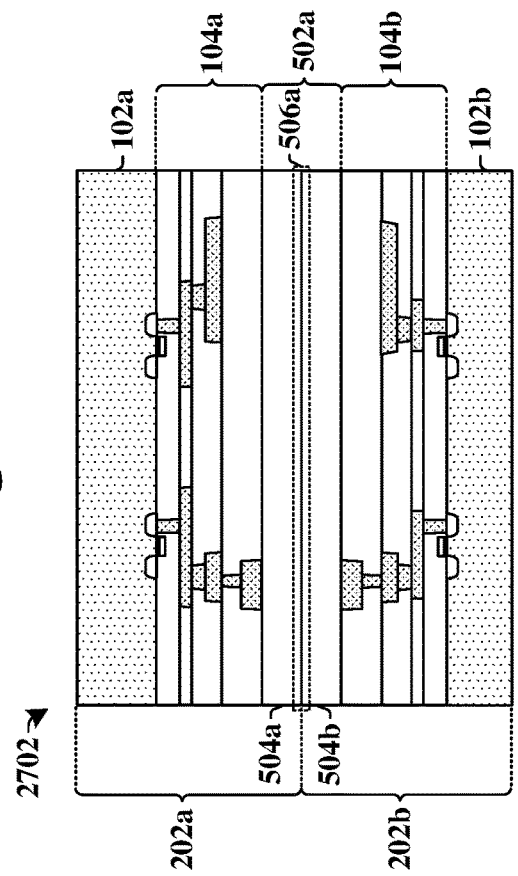
Fig. 27A
Fig. 27B
Fig. 27C
Fig. 27D

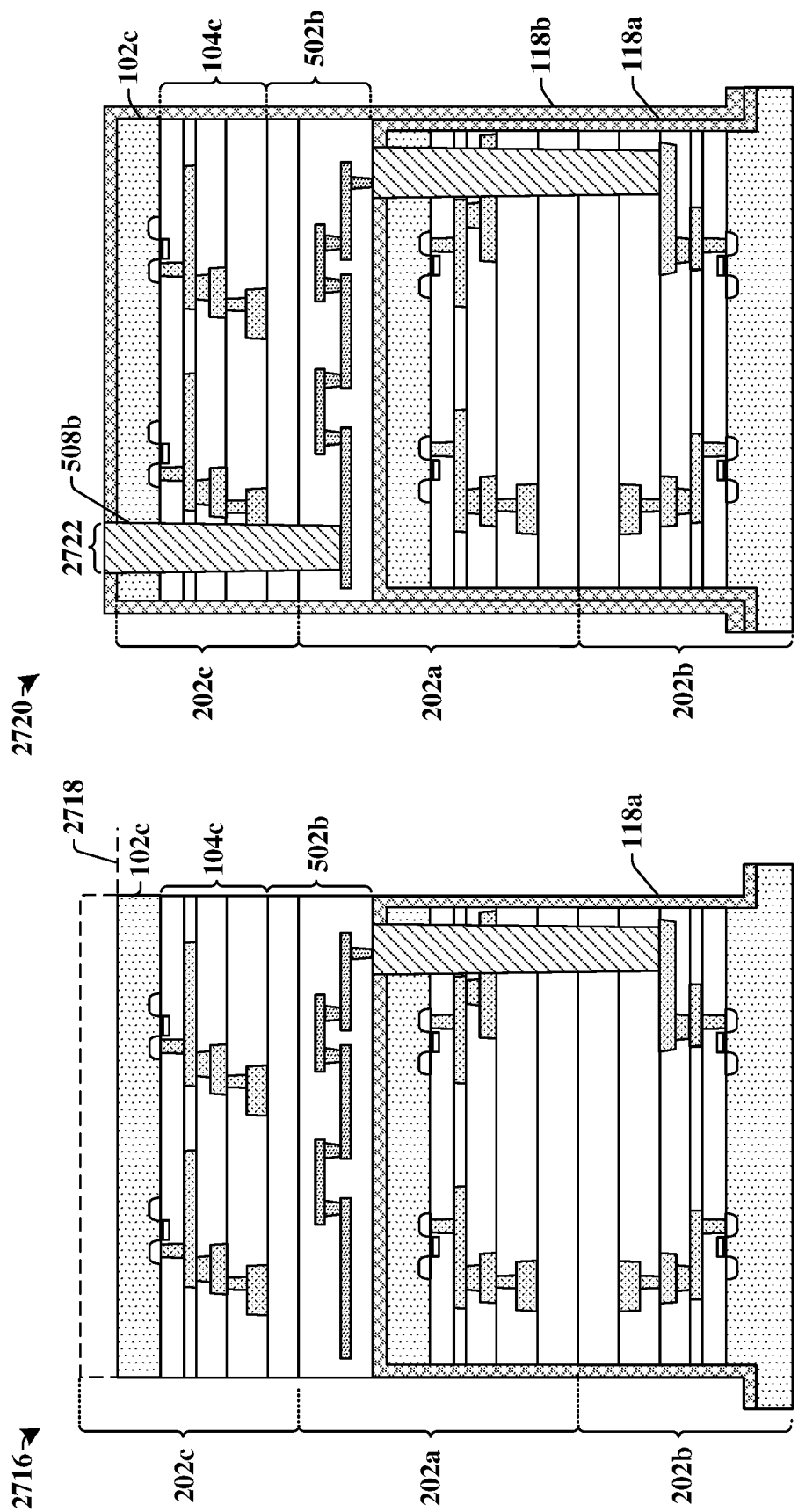

TRIM WALL PROTECTION METHOD FOR MULTI-WAFER STACKING

REFERENCE TO RELATED APPLICATION

This Application is a Continuation of U.S. application Ser. No. 16/785,866, filed on Feb. 10, 2020, which claims the benefit of U.S. Provisional Application No. 62/928,497, filed on Oct. 31, 2019. The contents of the above-referenced Patent Applications are hereby incorporated by reference in their entirety.

BACKGROUND

Multi-dimensional integrated chips are integrated chips that have multiple semiconductor die vertically stacked onto one another and electrically connected by way of through-substrate-vias (TSVs) extending through one or more of the semiconductor die. As lithographic scaling has become increasingly more difficult, multi-dimensional integrated chips have emerged as an attractive alternative to single die integrated chips (ICs). Multi-dimensional integrated chips offer a number of advantages over single die ICs, such as a small footprint, shorter interconnects between adjacent die, higher device density, and the ability to integrate different types of semiconductor die (e.g., memory, logic, MEMS, etc.) into a single integrated chip structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14-17D illustrate cross-sectional views of some embodiments of a method of forming a multi-dimensional integrated chip structure having a dielectric protection layer.

DETAILED DESCRIPTION

Figure 1A:
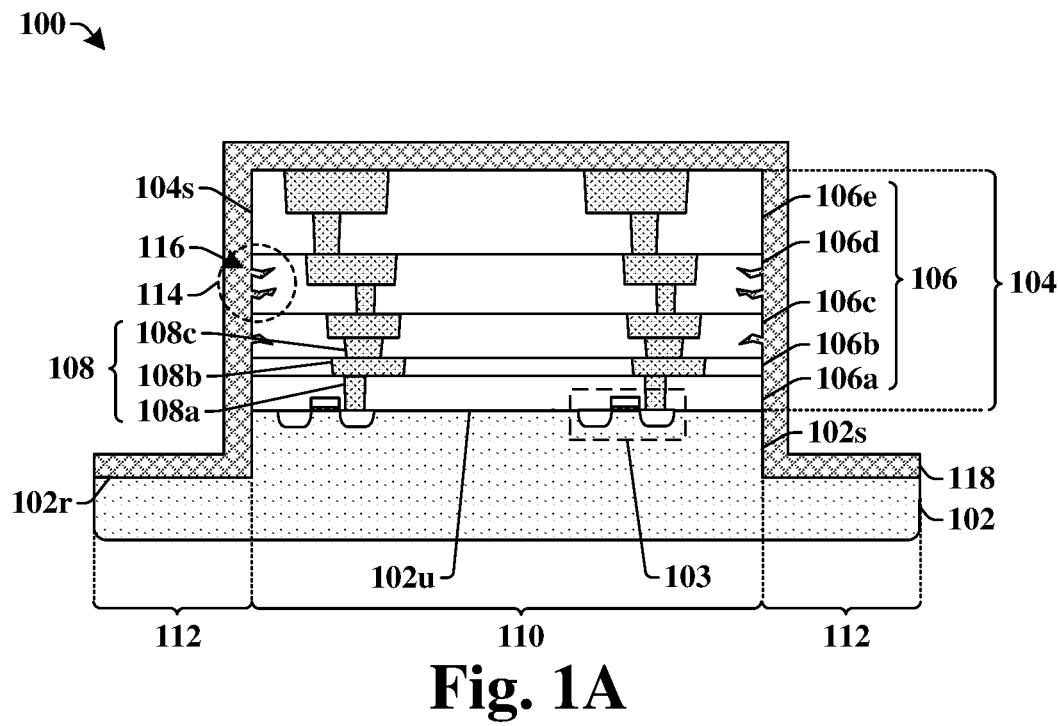
FIGS. 1A-1B illustrate some embodiments of an integrated chip structure having a dielectric protection layer configured to mitigate damage resulting from an edge trimming process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-dimensional integrated chips are generally formed by stacking a plurality of semiconductor substrates (e.g., semiconductor wafers) onto one another. For example, during a multi-dimensional integrated chip fabrication process a first wafer may be bonded to an overlying second wafer. After the bonding process is finished, the second wafer may be subsequently thinned to reduce a thickness of the second wafer. By thinning the second wafer, through-substrate-vias (TSV) are able to extend through the second wafer to an overlying wafer or bonding structure (e.g., bond pad).

The outer surface of a semiconductor wafer typically has a rounded shape as viewed in a cross-sectional view of the semiconductor wafer. Because of the rounded shape, a thinning process will cause the semiconductor wafer to become thinner along an outer edge, resulting in a sharp outer edge with low mechanical strength. The sharp outer edge can lead to chipping and/or flaking of the wafer during the subsequent processing. To prevent chipping or flaking, an edge trimming process may be performed on a wafer. An edge trimming process is a process by which a mechanical cutting tool uses a saw blade to remove material along an outer edge of a wafer. By removing material along an outer edge of a wafer, the sharp edge with low mechanical strength can be eliminated and chipping and/or flaking can be mitigated.

However, it has been appreciated that the saw blade used during an edge trimming process can cause damage to inter-level dielectric (ILD) layers overlying a wafer. For example, the edge trimming process can exert stresses onto the ILD layers that cause cracks to extend within low-k and/or extreme low-k dielectric materials. The damage caused by an edge trimming process can be aggravated by thermomechanical forces during subsequent fabrication processes (e.g., a wafer thinning process, a wafer bonding process, or the like) leading to die failure and/or reduced yield.

The present disclosure, relates to method of reducing damage from an edge trimming process on one or more inter-level dielectric (ILD) layers overlying a semiconductor substrate. In some embodiments, the method comprises forming one or more ILD layers over a semiconductor substrate. An edge trimming process is performed to remove parts of the ILD layers and the semiconductor substrate along a perimeter of the semiconductor substrate. A dielectric protection layer is subsequently formed over sidewalls of one or more ILD layers. The dielectric protection layer protects damaged areas within the one or more ILD layers that may have formed during the edge trimming process, thereby preventing aggravation of damage to the one or more ILD layers during subsequent fabrication processes.

Figure 1B:
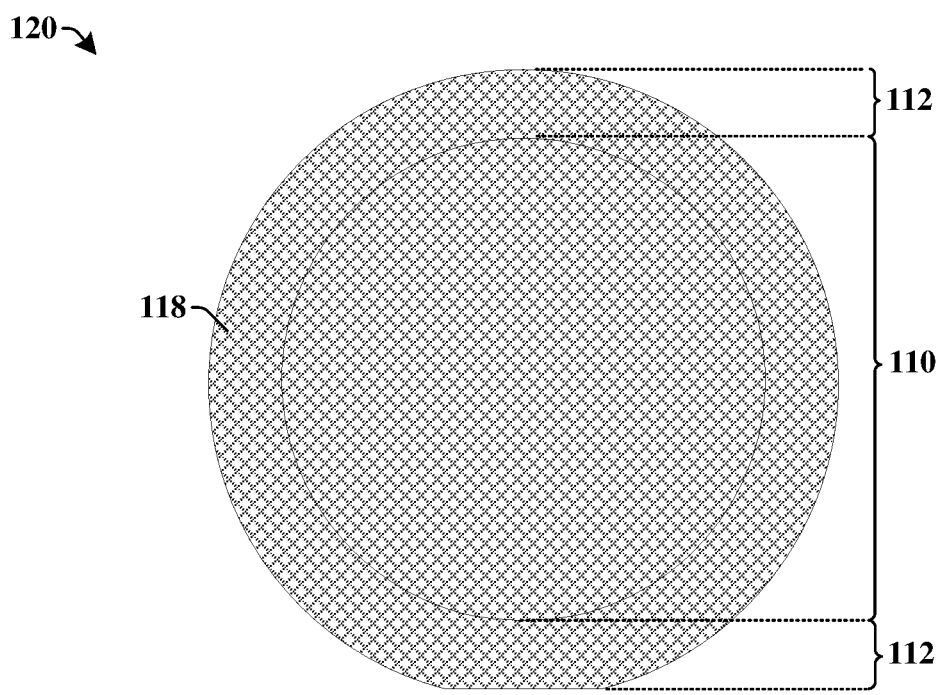

FIGS. 1A-1B illustrate some embodiments of an integrated chip structure having a dielectric protection layer configured to prevent damage resulting from an edge trimming process.

As shown in cross-sectional view 100 of FIG. 1A, an integrated chip structure comprises an interconnect structure 104 disposed over an upper surface 102u of a semiconductor substrate 102. The semiconductor substrate 102 comprises an interior sidewall 102s that couples the upper surface 102u of the semiconductor substrate 102 to a recessed surface 102r of the semiconductor substrate 102. The recessed surface 102r defines a recessed region 112 that surrounds a central region 110 of the semiconductor substrate 102. Within the recessed region 112, the semiconductor substrate 102 has a first thickness that is less than a thickness of the semiconductor substrate 102 within the central region 110. As shown in a top-view 120 of FIG. 1B, the recessed region 112 extends around a perimeter of the semiconductor substrate 102 and extends from the central region 110 to an outermost surface of the semiconductor substrate 102.

Referring again to cross-sectional view 100 of FIG. 1A, a plurality of transistor devices 103 are disposed within the upper surface 102u of the semiconductor substrate 102. In some embodiments, the semiconductor substrate 102 may comprise a semiconductor wafer and the plurality of transistor devices 103 may be disposed within a plurality of separate die regions, which respectively correspond to an integrated chip die within the semiconductor wafer. An interconnect structure 104 is over the upper surface 102u of the semiconductor substrate 102. The interconnect structure 104 comprises a plurality of interconnect layers 108 disposed within a dielectric structure 106 comprising one or more dielectric materials. The plurality of interconnect layers 108 are electrically coupled to the plurality of transistor devices 103. In some embodiments, the plurality of interconnect layers 108 may comprise conductive contacts 108a, interconnect wires 108b, and/or interconnect vias 108c. In some embodiments, the plurality of interconnect layers 108 may comprise copper, tungsten, aluminum, and/or the like.

The dielectric structure 106 comprises a plurality of stacked inter-level dielectric (ILD) layers 106a-106e surrounding the plurality of interconnect layers 108. In some embodiments (not shown), the plurality of stacked ILD layers 106a-106e may be vertically separated from one another by etch stop layers. One or more of the plurality of stacked ILD layers 106a-106e may comprise a low-k dielectric layer (i.e., a dielectric layer having a dielectric constant that is less than that of silicon dioxide), an ultra low-k dielectric material, an extreme low-k dielectric material, or the like. In some embodiments, one or more of the plurality of stacked ILD layers 106a-106e may have a damaged region 114 arranged along an outermost sidewall 104s of the interconnect structure 104. The damaged region 114 may be the result of stresses from an edge trimming process performed on the interconnect structure 104 and may define recesses within one or more of the plurality of stacked ILD layers 106a-106e. In some embodiments, the damaged region 114 may be within an ILD layer comprising a low-k dielectric material or an extreme low-k dielectric material.

A dielectric protection layer 118 is disposed over the semiconductor substrate 102 and along the outermost sidewall 104s of the interconnect structure 104. In some embodiments, the dielectric protection layer 118 may also line the recessed surface 102r, the interior sidewall 102s of the semiconductor substrate 102, and/or be disposed over the interconnect structure 104. In some embodiments, the dielectric protection layer 118 may further extend to within the recesses 116 within the damaged region 114. Because the dielectric protection layer 118 lines the outermost sidewall 104s of the interconnect structure 104, the dielectric protection layer 118 covers and/or encapsulates the damaged region 114. By covering and/or encapsulating the damaged region 114 of the interconnect structure 104, the interconnect structure 104 is protected from further damage caused by stresses (e.g., thermal stress, mechanical stress, thermomechanical stress, etc.) of subsequent fabrication processes (e.g., bonding processes, grinding processes, or the like), thereby improving integrated chip yield.

It will be appreciated that in various embodiments the disclosed dielectric protection layer may be located at different locations along a multi-dimensional integrated chip structure. FIGS. 2A-2D illustrate cross-sectional views of various embodiments of a dielectric protection layer on a multi-dimensional integrated chip structure having a plurality of tiers.

Figure 2A:
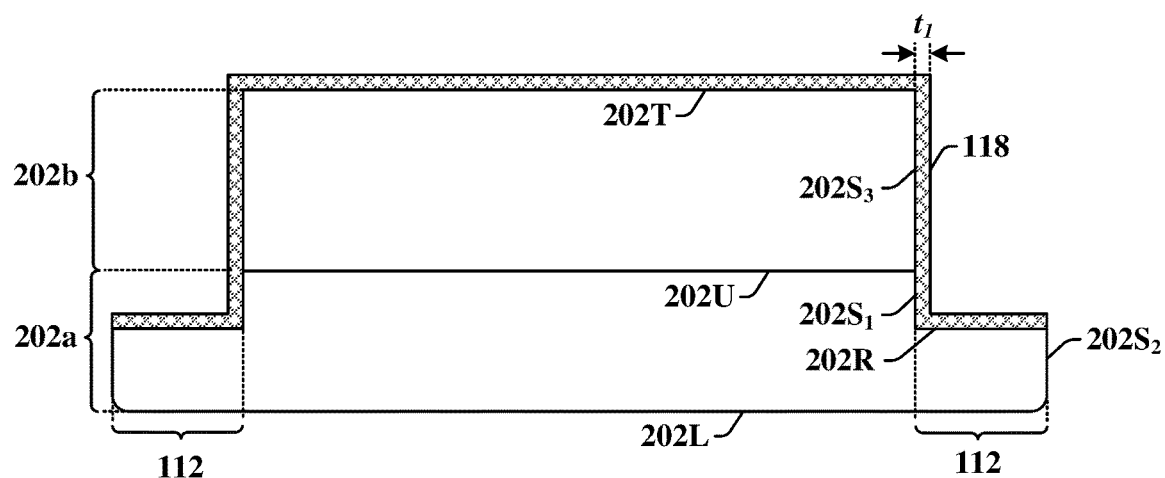
FIGS. 2A-2D illustrate cross-sectional views of some embodiments of multi-dimensional integrated chip structures having a dielectric protection layer.

FIG. 2A illustrates a cross-sectional view of some embodiments of a multi-dimensional integrated chip structure 200 having a dielectric protection layer.

The multi-dimensional integrated chip structure 200 comprises a first tier 202a and a second tier 202b disposed over the first tier 202a. The first tier 202a and the second tier 202b respectively comprise a semiconductor substrate (e.g., a silicon substrate, a germanium substrate, or the like). In some embodiments, the first tier 202a and/or the second tier 202b may further comprise an interconnect structure disposed on the semiconductor substrate. In various embodiments, the first tier 202a may comprise an interposer substrate, one or more TSV, and/or one or more logic devices. In various embodiments, the second tier 202b may comprise one or more logic devices, a MEMS (micro-electromechanical systems) device, a memory device, an image sensor device (e.g., a photodiode), or the like.

The first tier 202a has a lower surface 202L and an upper surface 202U. The upper surface 202U is coupled to inner sidewalls $202S_1$ of the first tier 202a that are directly over the lower surface 202L. The inner sidewalls $202S_1$ are further coupled to a recessed surface 202R that defines a recessed region 112. The recessed surface 202R extends from the inner sidewalls $202S_1$ of the first tier 202a to outermost sidewalls $202S_2$ of the first tier 202a. The second tier 202b is disposed over the upper surface 202U of the first tier 202a and is set back from the outermost sidewalls $202S_2$ of the first tier 202a by a non-zero distance.

A dielectric protection layer 118 is disposed onto the inner sidewalls $202S_1$ of the first tier 202a and onto outermost sidewalls $202S_3$ of the second tier 202b. The dielectric protection layer 118 further lines the recessed surface 202R. In some embodiments, the dielectric protection layer 118 may comprise silicon nitride, silicon oxynitride, silicon carbide, silicon dioxide, hafnium dioxide, tantalum pentoxide, aluminum oxide, zinc peroxide, or the like. In some embodiments, the dielectric protection layer 118 may have a first thickness $t_1$ that is greater than or equal to approximately 200 angstroms. In some embodiments, the dielectric protection layer 118 may have a first thickness $t_1$ that is between approximately 200 angstroms and approximately 2000 angstroms.

In some embodiments, the dielectric protection layer 118 may continuously extend over a top surface 202T of the second tier 202b, so that the top surface 202T is completely covered by the dielectric protection layer 118. In other embodiments (not shown), the top surface 202T of the second tier 202b is devoid of the dielectric protection layer 118. In some such embodiments, the dielectric protection layer 118 may have a top surface that is substantially aligned with the top surface 202T of the second tier 202b or that is below the top surface 202T of the second tier 202b.

Figure 2B:
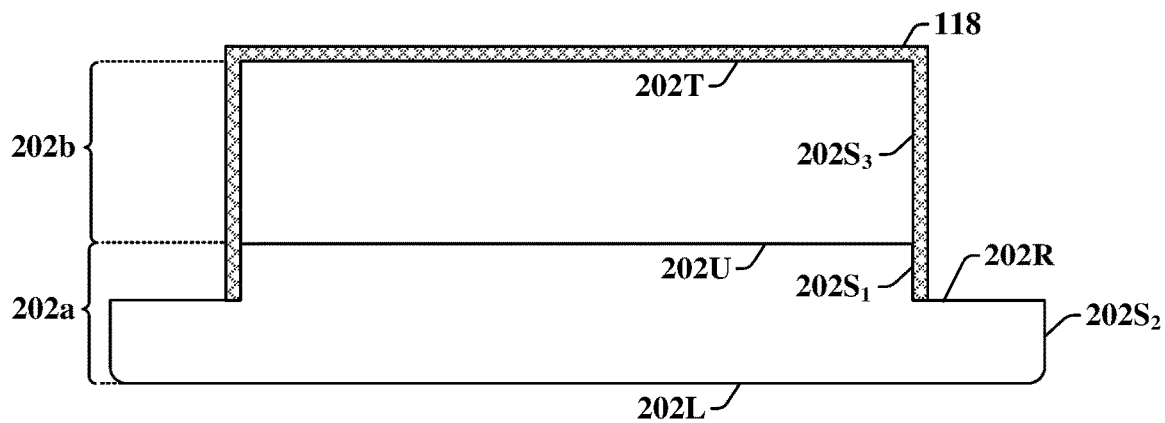

FIG. 2B illustrates a cross-sectional view 204 of some additional embodiments of a multi-dimensional integrated chip structure having a dielectric protection layer.

As shown in cross-sectional view 204 of FIG. 2B, a dielectric protection layer 118 is disposed onto the inner sidewalls $202S_1$ of the first tier 202a and onto the outermost sidewalls $202S_3$ of the second tier 202b. The recessed surface 202R continuously extends from directly below the dielectric protection layer 118 to laterally past an outermost sidewall of the dielectric protection layer 118.

Figure 2C:
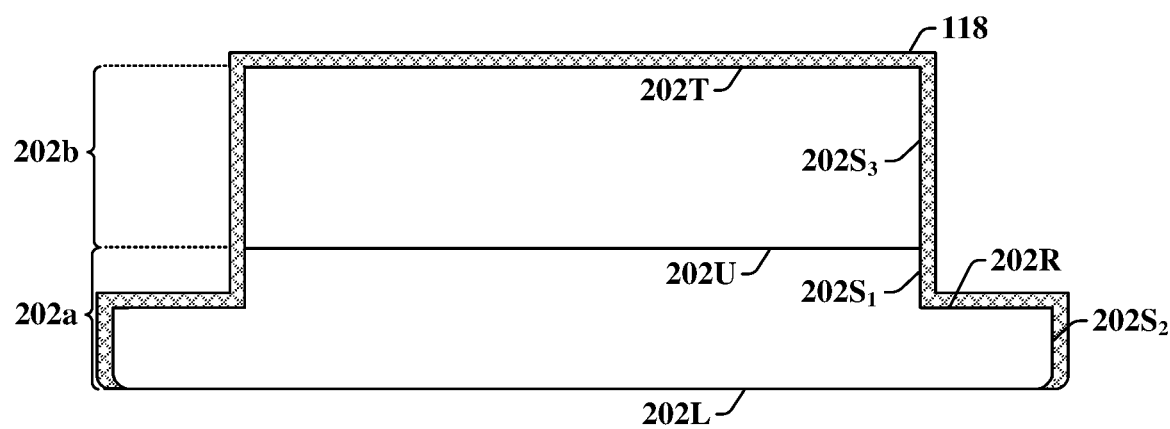

FIG. 2C illustrates a cross-sectional view 206 of some additional embodiments of a multi-dimensional integrated chip structure having a dielectric protection layer.

As shown in cross-sectional view 206 of FIG. 2C, a dielectric protection layer 118 is disposed onto the inner sidewalls $202S_1$ of the first tier 202a and onto the outermost sidewalls $202S_3$ of the second tier 202b. The dielectric protection layer 118 continuously extends from the inner sidewalls $202S_1$ of the first tier 202a, over the recessed surface 202R and to the outermost sidewalls $202S_2$ of the first tier 202a.

Figure 2D:
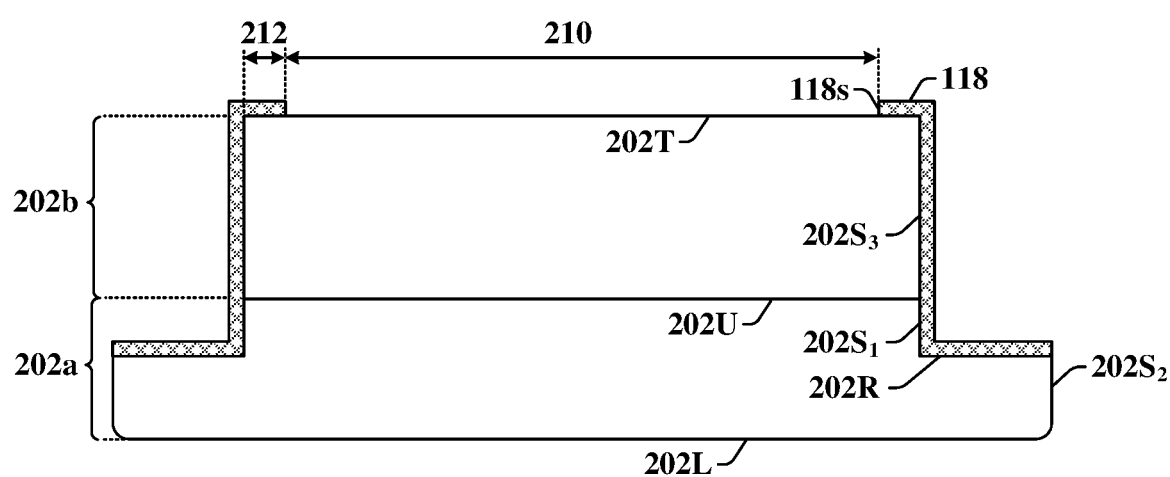

FIG. 2D illustrates a cross-sectional view 208 of some additional embodiments of a multi-dimensional integrated chip structure having a dielectric protection layer.

As shown in cross-sectional view 208 of FIG. 2D, a dielectric protection layer 118 extends from the recessed surface 202R, along the inner sidewalls $202S_1$ of the first tier 202a and the outermost sidewalls $202S_3$ of the second tier 202b, to over the top surface 202T of the second tier 202b. The dielectric protection layer 118 comprises one or more sidewalls 118s that define an opening 210 over the top surface 202T of the second tier 202b. In some embodiments, the one or more sidewalls 118s are disposed directly over the top surface 202T of the second tier 202b. In some such embodiments, the dielectric protection layer 118 extends for a non-zero distance 212 past the outermost sidewalls $202S_3$ of the second tier 202. In some embodiments, the non-zero distance 212 is greater than approximately 500 angstroms. In some such embodiments, the non-zero distance is in a range of between approximately 500 angstroms and approximately 2 mm. In other embodiments, the non-zero distance 212 may be greater than approximately 100 angstroms, greater than approximately 250 angstroms, greater than approximately 350 angstroms, or greater than approximately 400 angstroms.

Figure 3A:
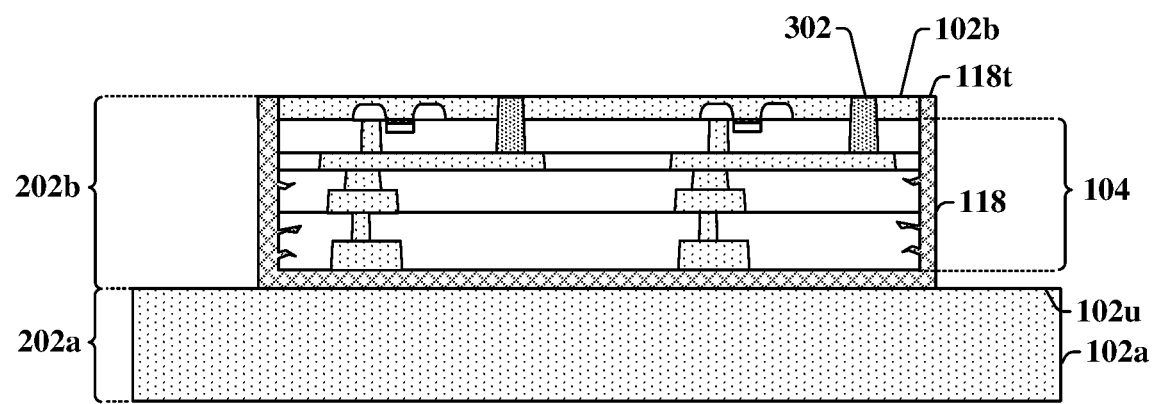
FIGS. 3A-3B illustrate cross-sectional views of some additional embodiments of multi-dimensional integrated chip structures having a dielectric protection layer.

FIG. 3A illustrates a cross-sectional view of some additional embodiments of a multi-dimensional integrated chip structure 300 having a dielectric protection layer.

The multi-dimensional integrated chip structure 300 comprises a first tier 202a and a second tier 202b. The first tier 202a comprises a first semiconductor substrate 102a. The second tier 202b comprises an interconnect structure 104 including a plurality of interconnect layers disposed within a dielectric structure on a front-side of a second semiconductor substrate 102b. In some embodiments, an upper surface 102u of the first semiconductor substrate 102a laterally extends past opposing sides of the second tier 202b. A plurality of through-substrate-vias (TSVs) 302 extend from the front-side of the second semiconductor substrate 102b to a back-side of the second semiconductor substrate 102b. In some embodiments, the first semiconductor substrate 102a may have a first thickness that is greater than a second thickness of the second semiconductor substrate 102b.

A dielectric protection layer 118 is disposed on sidewalls of the second semiconductor substrate 102b and the interconnect structure 104. The dielectric protection layer 118 separates the first semiconductor substrate 102a from the interconnect structure 104. In some embodiments, the dielectric protection layer 118 may have a top surface 118t that is substantially aligned with a back-side of the second semiconductor substrate 102b facing away from the first semiconductor substrate 102a.

Figure 3B:
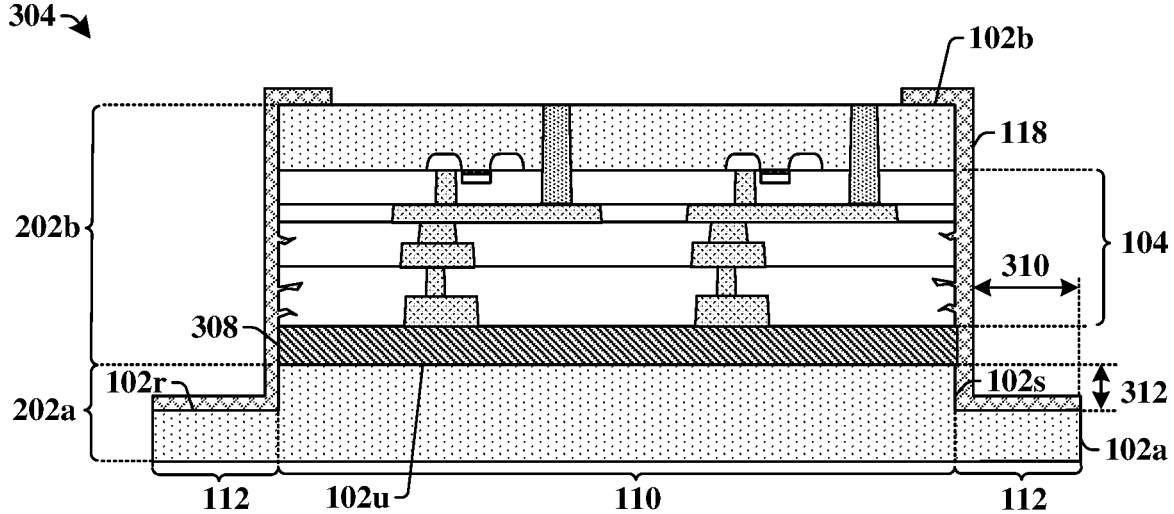

FIG. 3B illustrates a cross-sectional view of some additional embodiments of a multi-dimensional integrated chip structure 304 having a dielectric protection layer.

The multi-dimensional integrated chip structure 304 comprises a first tier 202a and a second tier 202b. The first tier 202a comprises a first semiconductor substrate 102a having a central region 110 surrounded by a recessed region 112. The central region 110 is defined by an upper surface 102u of the first semiconductor substrate 102a. The recessed region 112 is defined by an interior sidewall 102s of the first semiconductor substrate 102a and a recessed surface 102r of the first semiconductor substrate 102a. The second tier 202b comprises an interconnect structure 104 on a front-side of a second semiconductor substrate 102b. In some embodiments, the interconnect structure 104 is bonded to the upper surface 102u by way of a bonding region 308.

In some embodiments, the recessed surface 102r of the first semiconductor substrate 102a may have a first width 310. In some embodiments, the first width 310 may less than or equal to approximately 2 microns. In other embodiments, the first width 310 may be in a range of between approximately 5 millimeters (mm) and approximately 20 mm. In yet other embodiments, the first width 310 may be in a range of between approximately 10 mm and approximately 30 mm.

In some embodiments, the interior sidewall 102s of the first semiconductor substrate 102a may have a first depth 312. In some embodiments, the first depth 312 may greater than or equal to approximately 20 microns.

A dielectric protection layer 118 is disposed on the recessed surface 102r of the first semiconductor substrate 102a and along the interior sidewall 102s of the first semiconductor substrate 102a, the interconnect structure 104, and the second semiconductor substrate 102b. In some embodiments, the dielectric protection layer 118 may extend over a back-side of the second semiconductor substrate 102b.

FIGS. 4A-4D illustrate some embodiments of multi-dimension integrated chip structures that comprise a dielectric protection layer and a hybrid bonding interface.

Figure 4A:
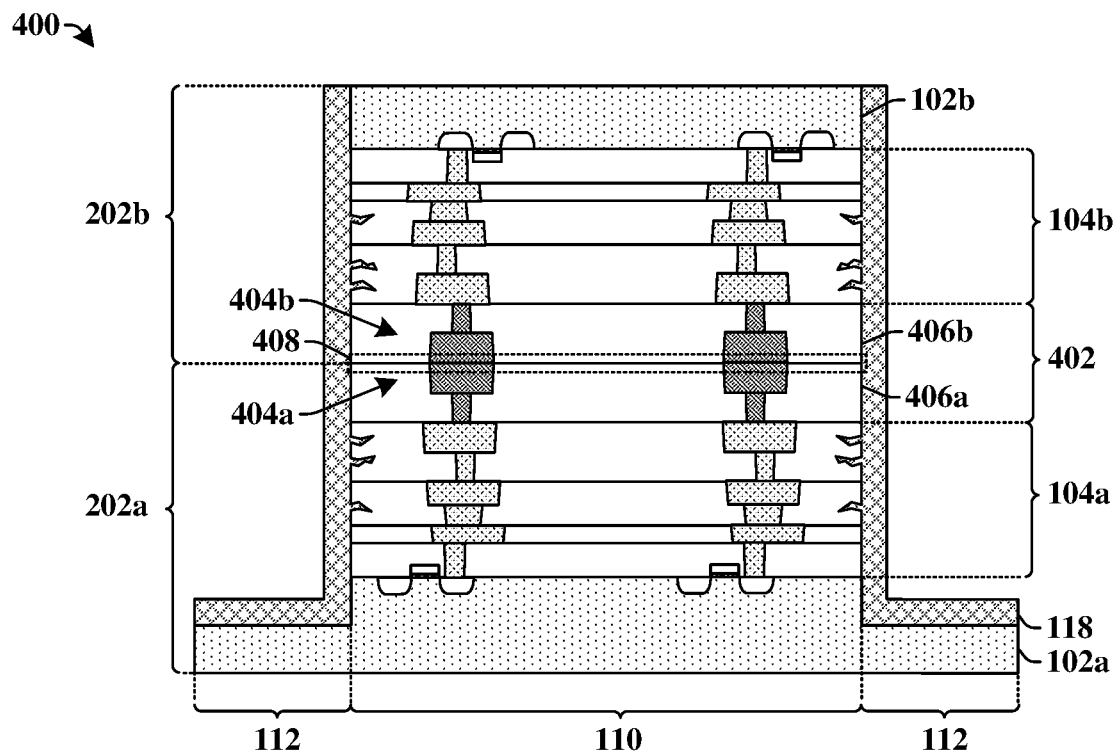
FIGS. 4A-4D illustrate cross-sectional views of some embodiments of multi-dimensional integrated chip structures having a hybrid bonding region and a dielectric protection layer.

FIG. 4A illustrates a cross-sectional view of some embodiments of a multi-dimensional integrated chip structure 400 bonded in a face-to-face configuration with a dielectric protection layer.

The multi-dimensional integrated chip structure 400 comprises a first tier 202a and a second tier 202b. The first tier 202a comprises a first semiconductor substrate 102a having a central region 110 surrounded by a recessed region 112. A first interconnect structure 104a is disposed onto the central region 110 of the first semiconductor substrate 102a. The second tier 202b comprises a second interconnect structure 104b disposed on a front-side of a second semiconductor substrate 102b. In some embodiments, the first semiconductor substrate 102a may have a first thickness that is less than a second thickness of the second semiconductor substrate 102b.

The first interconnect structure 104a is bonded to the second interconnect structure 104b along a hybrid bonding region 402. The hybrid bonding region 402 comprises a first plurality of conductive bond features 404a disposed within a first dielectric layer 406a and a second plurality of conductive bond features 404b disposed within a second dielectric layer 406b. In some embodiments, the first plurality of conductive bond features 404a and the second plurality of conductive bond features 404b may comprise copper, aluminum, or the like. In some embodiments the first dielectric layer 406a and the second dielectric layer 406b may comprise an oxide, a nitride, or the like. Along a hybrid interface 408, first plurality of conductive bond features 404a contact the second plurality of conductive bond features 404b along a first interface and the first dielectric layer 406a contacts the second dielectric layer 406b along a second interface.

A dielectric protection layer 118 is disposed on sidewalls of the first semiconductor substrate 102a, the first interconnect structure 104a, the second semiconductor substrate 102b, the second interconnect structure 104b, and the hybrid bonding region 402.

Figure 4B:
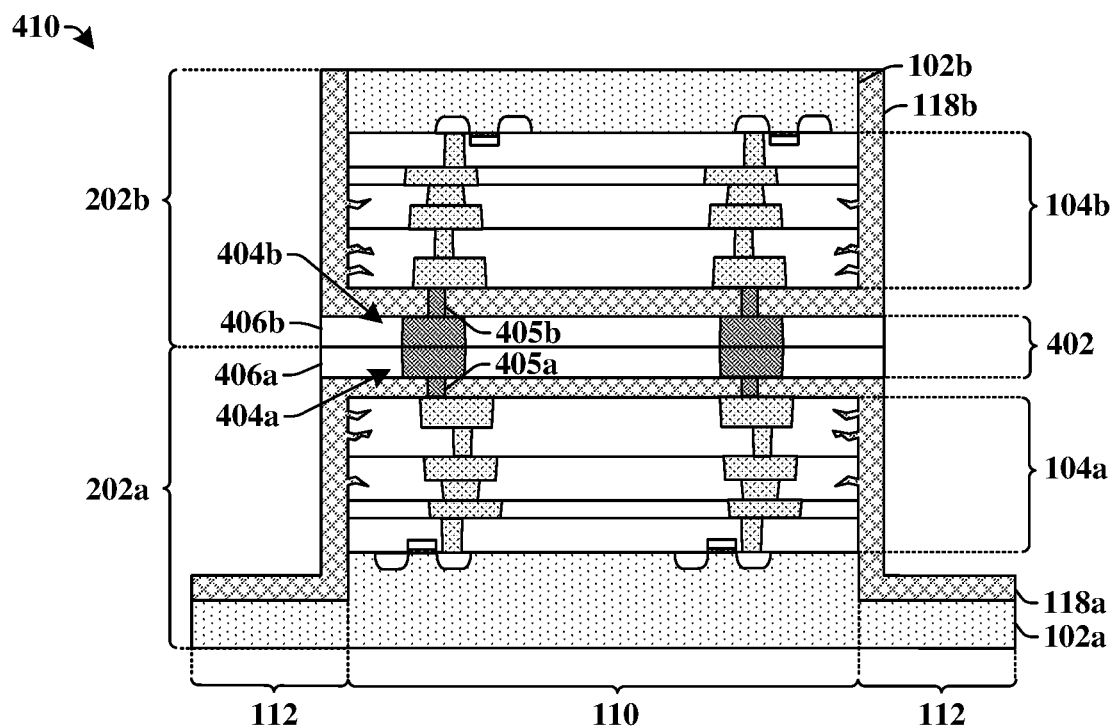

FIG. 4B illustrates a cross-sectional view of some additional embodiments of a multi-dimensional integrated chip structure 410 bonded in a face-to-face configuration with a dielectric protection layer.

The multi-dimensional integrated chip structure 410 comprises a first dielectric protection layer 118a disposed on sidewalls of a first semiconductor substrate 102a and a first interconnect structure 104a. The first dielectric protection layer 118a may further extend over a top of the first interconnect structure 104a. A second dielectric protection layer 118b is disposed on sidewalls of a second semiconductor substrate 102b and a second interconnect structure 104b. The second dielectric protection layer 118b may further extend over a top of the second interconnect structure 104b.

The first interconnect structure 104a is bonded to the second interconnect structure 104b along a hybrid bonding region 402 disposed between the first dielectric protection layer 118a and the second dielectric protection layer 118b. The hybrid bonding region 402 comprises a first plurality of conductive bond features 404a disposed within a first dielectric layer 406a and a second plurality of conductive bond features 404b disposed within a second dielectric layer 406b. The first plurality of conductive bond features 404a are coupled to the first interconnect structure 104a by way of a first conductive feature 405a extending through the first dielectric protection layer 118a. The second plurality of conductive bond features 404b are coupled to the second interconnect structure 104b by way of a second conductive feature 405b extending through the second dielectric protection layer 118b.

In some embodiments, the first dielectric layer 406a and the second dielectric layer 406b may extend to outer sidewalls of the first dielectric protection layer 118a and/or the second dielectric protection layer 118b. In some such embodiments, outermost sidewalls of the first dielectric layer 406a and the second dielectric layer 406b are not cover by the first dielectric protection layer 118a or the second dielectric protection layer 118b.

Figure 4C:
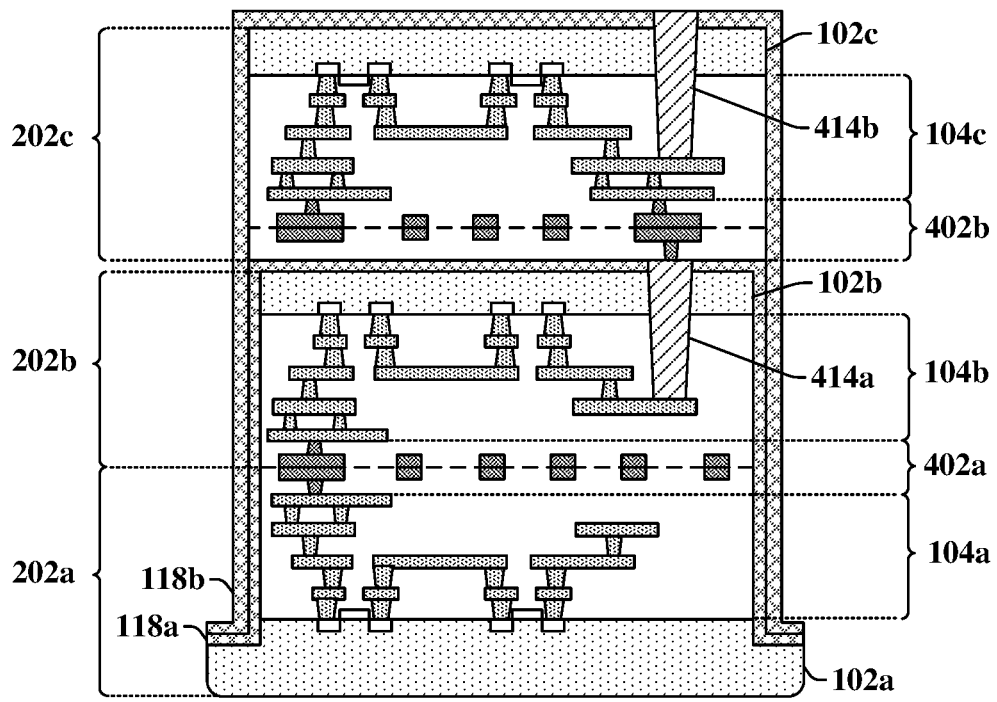

FIG. 4C illustrates a cross-sectional view of some additional embodiments of a multi-dimensional integrated chip structure 412 bonded in face-to-face and face-to-back configurations with a dielectric protection layer.

The multi-dimensional integrated chip structure 412 comprises a first tier 202a comprising a first interconnect structure 104a disposed on a first semiconductor substrate 102a, a second tier 202b comprising a second interconnect structure 104b disposed on a second semiconductor substrate 102b, and a third tier 202c comprising a third interconnect structure 104c disposed on a third semiconductor substrate 102c.

The first tier 202a is bonded to the second tier 202b in a face-to-face configuration, so that the first interconnect structure 104a and the second interconnect structure 104b are disposed between a front-side of the first semiconductor substrate 102a and a front-side of the second semiconductor substrate 102b. In some embodiments, the first interconnect structure 104a and the second interconnect structure 104b are bonded together by way of a first hybrid bonding region 402a.

The second tier 202b is bonded to the third tier 202c in a back-to-face configuration, so that the third interconnect structure 104c is disposed between a back-side of the second semiconductor substrate 102b and a front-side of the third semiconductor substrate 102c. In some embodiments, the second semiconductor substrate 102b and the third interconnect structure 104c are bonded together by way of a second hybrid bonding region 402b.

A first dielectric protection layer 118a covers sidewalls of the first semiconductor substrate 102a, the first interconnect structure 104a, the first hybrid bonding region 402a, the second interconnect structure 104b, and the second semiconductor substrate 102b. The first dielectric protection layer 118a further covers the back-side of the second semiconductor substrate 102b. A second dielectric protection layer 118b covers sidewalls of the first dielectric protection layer 118a, the second hybrid bonding region 402b, the third interconnect structure 104c, and the third semiconductor substrate 102c. The second dielectric protection layer 118b further covers a back-side of the third semiconductor substrate 102c.

A first BTSV (back-side through substrate via) 414a extends through the second semiconductor substrate 102b and the first dielectric protection layer 118a to electrically couple the second interconnect structure 104b to the third interconnect structure 104c. A second BTSV 414b extends through the third semiconductor substrate 102c and the second dielectric protection layer 118b.

Figure 4D:
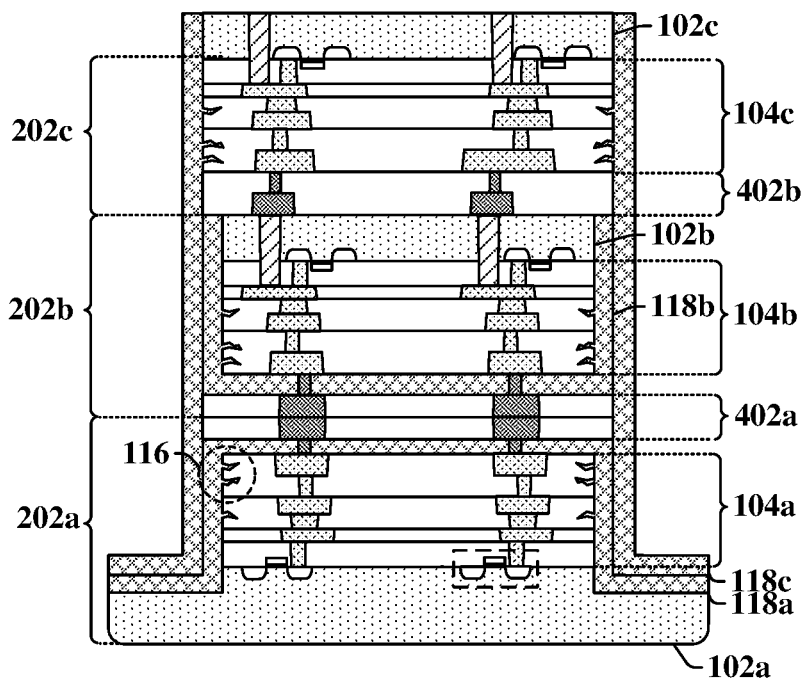

FIG. 4D illustrates a cross-sectional view of some additional embodiments of a multi-dimensional integrated chip structure 416 bonded in face-to-face and face-to-back configurations with a dielectric protection layer.

The multi-dimensional integrated chip structure 416 comprises a first tier 202a, a second tier 202b, and a third tier 202c. The first tier 202a is coupled to the second tier 202b in a face-to-face configuration by way of a first hybrid bonding region 402a. The second tier 202b is coupled to the third tier 202c in a face-to-back configuration by way of a second hybrid bonding region 402b. A first dielectric protection layer 118a covers sidewalls and a horizontally extending surface of the first tier 202a. A second dielectric protection layer 118b covers sidewalls and a horizontally extending surface of the second tier 202b. A third dielectric protection layer 118c covers sidewalls of the first dielectric protection layer 118a, the second dielectric protection layer 118b, the first hybrid bonding region 402a, the second hybrid bonding region 402b, and the third tier 202c.

Figure 5:
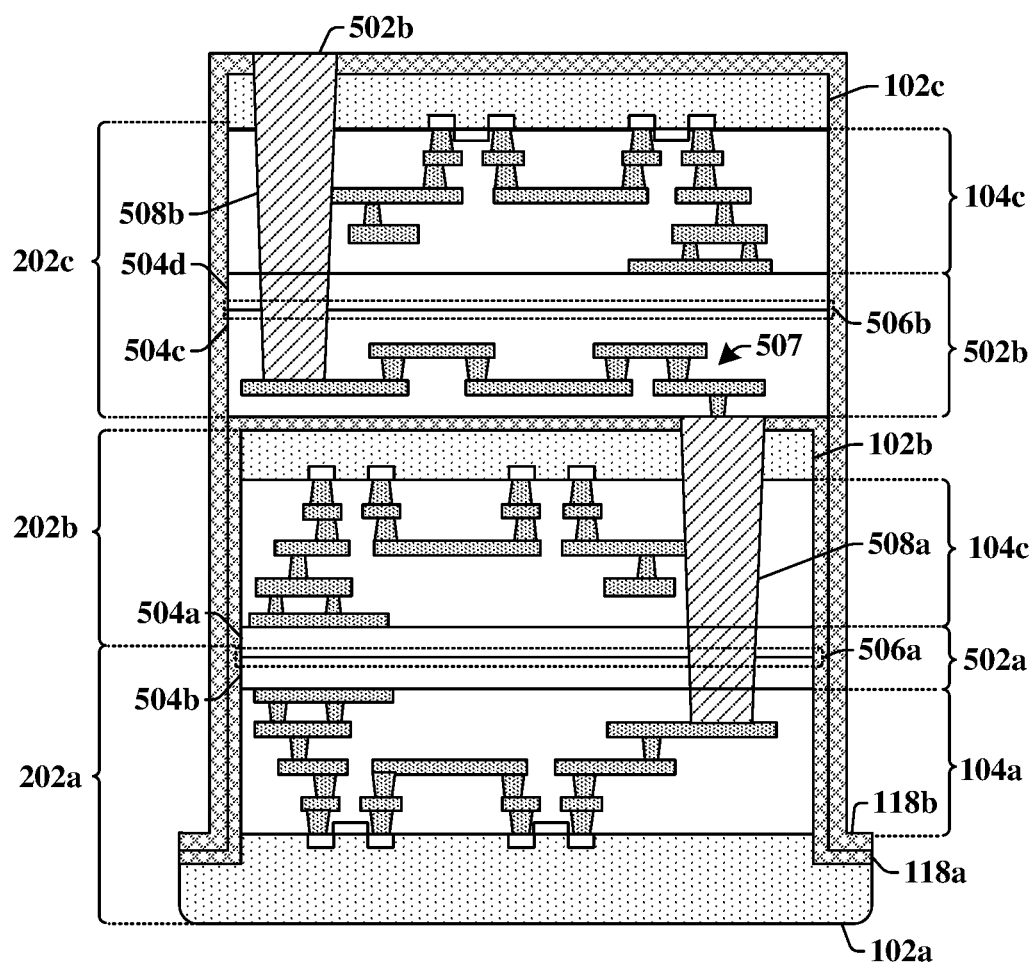
FIG. 5 illustrates a cross-sectional view of some embodiments of multi-dimensional integrated chip structures having a dielectric bonding region and a dielectric protection layer.

FIG. 5 illustrates a cross-sectional view of some additional embodiments of multi-dimensional integrated chip structure 500 comprising a dielectric protection layer and a dielectric bonding interface.

The multi-dimensional integrated chip structure 500 comprises a first tier 202a, a second tier 202b, and a third tier 202c. The first tier 202a is coupled to the second tier 202b in a face-to-face configuration by way of a first dielectric bonding region 502a having two different dielectric bonding structures 504a-504b that meet along a first dielectric interface 506a. The second tier 202b is coupled to the third tier 202c in a face-to-back configuration by way of a second dielectric bonding region 502b having two different dielectric bonding structures 504c-504d that meet along a second dielectric interface 506b. In some embodiments, a third dielectric bonding structure 504c may surrounding one or more redistribution layers 507 comprising a conductive material. A first dielectric protection layer 118a covers sidewalls of the first tier 202a, the second tier 202b, and the first dielectric bonding region 502a. A second dielectric protection layer 118b covers sidewalls of the first dielectric protection layer 118a, the second dielectric bonding region 502b, and the third tier 202c.

A first BTSV 508a extends through the first dielectric protection layer 118a, the second tier 202b, and the first dielectric interface 506a of the first dielectric bonding region 502a. The first BTSV 508a electrically contacts interconnect layers within the first tier 202a and the second tier 202b. A second BTSV 508b extends through the second dielectric protection layer 118b, the third tier 202c, and the second dielectric interface 506b of the second dielectric bonding region 502b. The second BTSV 508b electrically contacts interconnect layers within the second tier 202b and the third tier 202c.

Figures 6, 7:
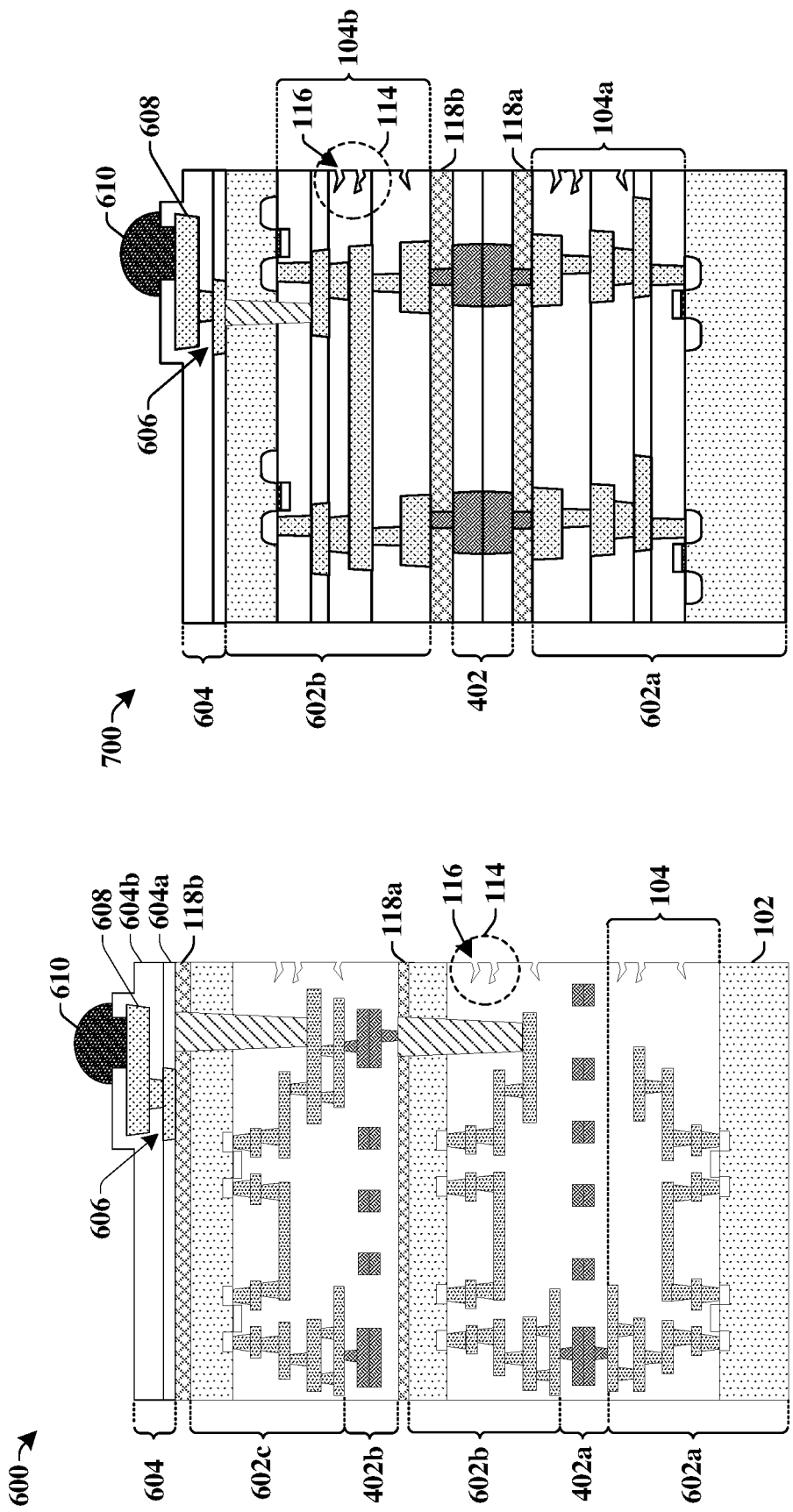
FIGS. 6-7 illustrate cross-sectional views of some embodiments of singulated integrated chip structures having a dielectric protection layer.

FIGS. 6-7 illustrate cross-sectional views of some embodiments of singulated (e.g., diced) integrated chip structures having a dielectric protection layer.

FIG. 6 illustrates a cross-sectional view of some embodiment of a singulated integrated chip structure 600.

The singulated integrated chip structure 600 comprises plurality of integrated chip (IC) die 602a-602c stacked onto one another. In some embodiments, the plurality of IC die 602a-602c may comprise a first IC die 602a, a second IC die 602b, and a third IC die 602c. The first IC die 602a, the second IC die 602b, and the third IC die 602c respectively comprise an interconnect structure 104 disposed on a semiconductor substrate 102. The first IC die 602a is bonded to the second IC die 602b by way of a first hybrid bonding region 402a, and the second IC die 602b is bonded to the third IC die 602c by way of a second hybrid bonding region 402b. Sidewalls of the first IC die 602a, the second IC die 602b, and the third IC die 602c are substantially aligned along a line that is perpendicular to a top surface of the first IC die 602a.

A first dielectric protection layer 118a is disposed between two of the IC die. For example, in some embodiments, the first dielectric protection layer 118a may be disposed between the second IC die 602b and the third IC die 602c. In some embodiments, a second dielectric protection layer 118b is disposed over the third IC die 602c. The first dielectric protection layer 118a and the second dielectric protection layer 118b have top and bottom surfaces that extend between opposing outermost sidewalls of the first dielectric protection layer 118a and the second dielectric protection layer 118b, respectively. In some embodiments, the outermost sidewalls of the first dielectric protection layer 118a and the second dielectric protection layer 118b are substantially aligned with outermost sidewalls of the first IC die 602a, the second IC die 602b, and the third IC die 602c. In some such embodiments, the first dielectric protection layer 118a and the second dielectric protection layer 118b are not disposed along sidewalls of one or more of the plurality of IC die 602a-602c.

In some embodiments, the first IC die 602a, the second IC die 602b, and/or the third IC die 602c may comprise a damaged region 114 disposed along a first side of the singulated integrated chip structure 600. The damaged region 114 may define one or more recesses 116 within a dielectric material. In some such embodiments, an opposing second side of the singulated integrated chip structure 600 may be devoid of a damaged region.

In some embodiments, a passivation structure 604 comprising one or more passivation layers 604a-604b is disposed over the second dielectric protection layer 118b. In some embodiments, one or more redistribution layers 606 may be disposed within the passivation structure 604. The one or more redistribution layers 606 may be configured to electrically couple the plurality of IC die 602a-602c to a bond pad 608 disposed on or over the passivation structure 604. In some embodiments, a conductive solder bump 610 is disposed onto the bond pad 608.

FIG. 7 illustrates a cross-sectional view of some additional embodiment of a singulated integrated chip structure 700.

The singulated integrated chip structure 700 comprises a plurality of integrated chip (IC) die 602a-602b stacked onto one another. In some embodiments, the plurality of IC die 602a-602b may comprise a first IC die 602a and a second IC die 602b. The first IC die 602a is bonded to a second IC die 602b by way of a hybrid bonding region 402. A first dielectric protection layer 118a and a second dielectric protection layer 118b are disposed on opposing sides of the hybrid bonding region 402. The first dielectric protection layer 118a separates the hybrid bonding region 402 from the first interconnect structure 104a. The second dielectric protection layer 118b separates the hybrid bonding region 402 from the second interconnect structure 104b.

FIGS. 8-12B illustrate cross-sectional views 800-1202 of some embodiments of a method of forming an integrated chip structure having a dielectric protection layer. Although FIGS. 8-12B are described in relation to a method, it will be appreciated that the structures disclosed in FIGS. 8-12B are not limited to such a method, but instead may stand alone as structures independent of the method.

Figure 8:
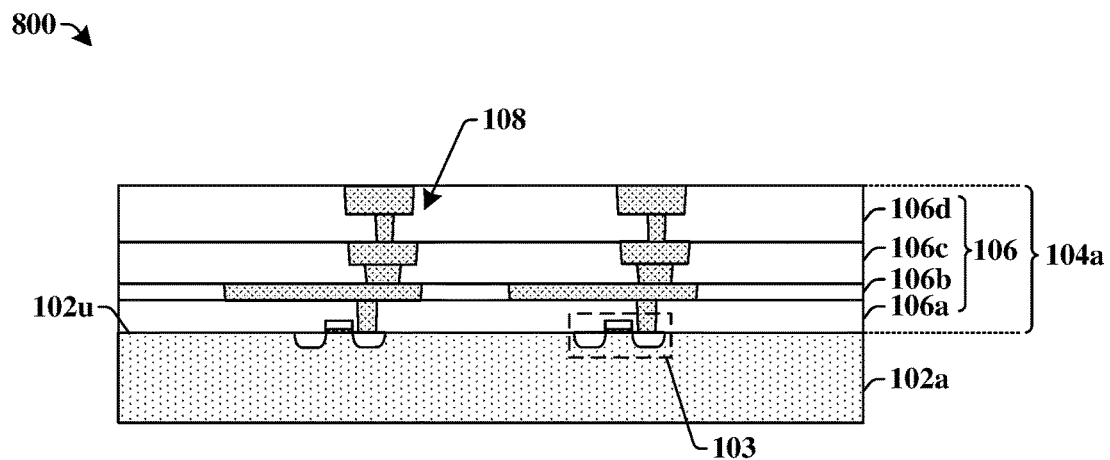
FIGS. 8-12B illustrate cross-sectional views of some embodiments of a method of forming an integrated chip structure having a dielectric protection layer configured to mitigate damage resulting from an edge trimming process.

As shown in cross-sectional view 800 of FIG. 8, one or more transistor devices 103 are formed within a first semiconductor substrate 102a. In various embodiments, the first semiconductor substrate 102a may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the transistor devices 103 may comprise a transistor formed by depositing a gate dielectric film and a gate electrode film over the first semiconductor substrate 102a. The gate dielectric film and the gate electrode film are subsequently patterned to form a gate dielectric and a gate electrode. The first semiconductor substrate 102a may be subsequently implanted to form a source region and a drain region within the first semiconductor substrate 102a on opposing sides of the gate electrode.

After formation of the transistor devices 103, a first interconnect structure 104a is formed over an upper surface 102u of the first semiconductor substrate 102a. The first interconnect structure 104a comprises a dielectric structure 106 having one or more stacked ILD layers 106a-106d respectively surrounding one or more interconnect layers 108. In some embodiments, the first interconnect structure 104a may be formed by forming an ILD layer over the first semiconductor substrate 102a, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench to fill the opening, and performing a planarization process (e.g., a chemical mechanical planarization process). In some embodiments, the ILD layer may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like.

Figure 9:
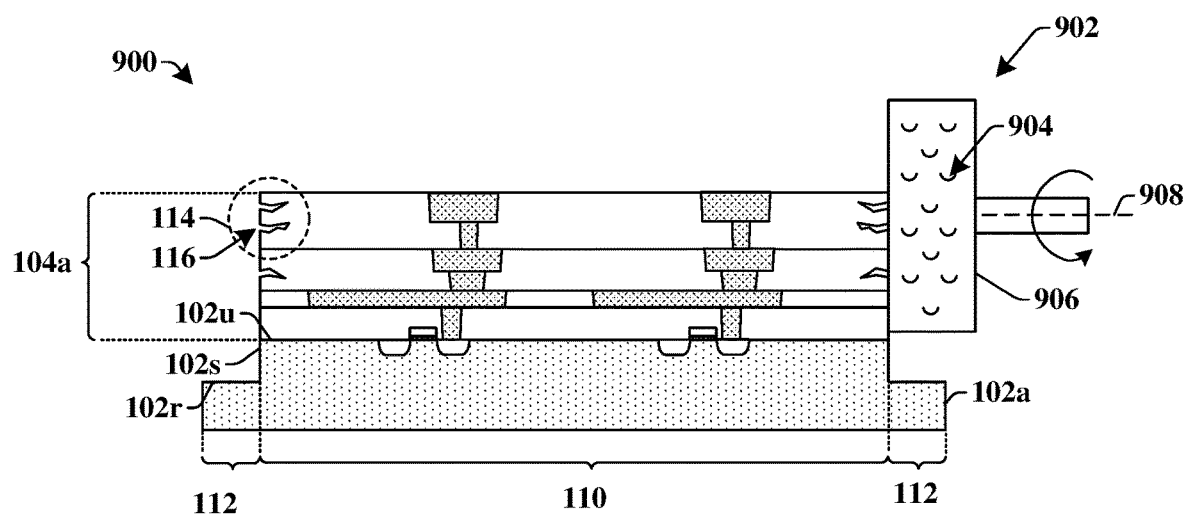

As shown in cross-sectional view 900 of FIG. 9, an edge trimming process is performed. The edge trimming process removes parts of the first semiconductor substrate 102a and the first interconnect structure 104a along a perimeter of the first semiconductor substrate 102a. By removing parts of the first semiconductor substrate 102a, the edge trimming process defines a central region 110 and a recessed region 112 of the first semiconductor substrate 102a. In some embodiments, the recessed region 112 is defined by a recessed surface coupled to an upper surface 102u by an interior sidewall 102s of the first semiconductor substrate 102a.

In some embodiments, the edge trimming process may be performed by bringing a blade 902 into contact with the first semiconductor substrate 102a and the first interconnect structure 104a along a closed loop that extends along a perimeter of the first semiconductor substrate 102a. The blade 902 has abrasive elements 904 (e.g., diamond particles) bonded to a core 906 having a circular cross-section. The core 906 is configured to rotate around an axis 908, as the abrasive elements 904 are brought into contact with the first semiconductor substrate 102a and the first interconnect structure 104a. During the edge trimming process, the blade 902 exerts stresses on the first interconnect structure 104a.

The stresses can damage the first interconnect structure 104a and form a damaged region 114 defining one or more recesses 116 within the first interconnect structure 104a.

Figure 10:
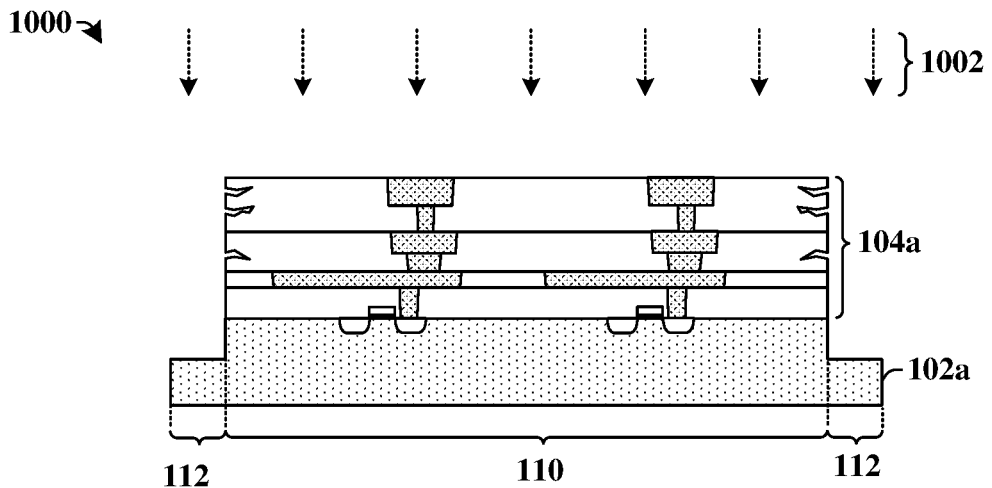

As shown in cross-sectional view 1000 of FIG. 10, a cleaning process may be performed after the edge trimming process is completed. In some embodiments, the cleaning process may comprise a wet cleaning process. In such embodiments, the wet cleaning process may expose the first semiconductor substrate 102a and the first interconnect structure 104a to one or more liquids 1002 (e.g., acetone, DI water, etc.) to remove debris from the edge trimming process. In other embodiments, the cleaning process may comprise a dry cleaning process.

Figure 11:
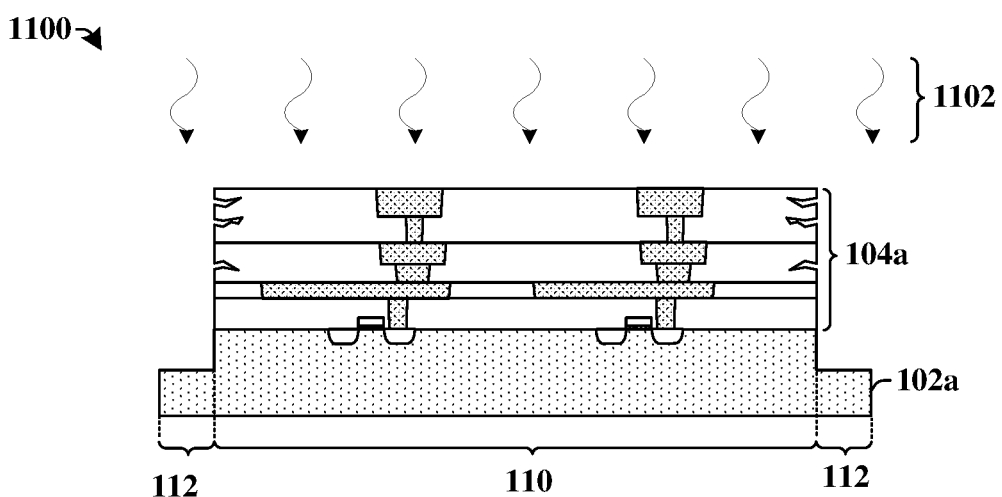

As shown in cross-sectional view 1100 of FIG. 11, an anneal process 1102 may be performed after the cleaning process is completed. The anneal process 1102 is performed to remove unwanted moisture (e.g., moisture from a wet cleaning process) from the first semiconductor substrate 102a and the first interconnect structure 104a. The anneal process may be performed by exposing the first semiconductor substrate 102a and the first interconnect structure 104a to an elevated temperature. In some embodiments, the elevated temperature may be greater than approximately 100° C. In some additional embodiments, the elevated temperature may be greater than approximately 200° C., greater than approximately 300° C., greater than approximately 400° C., or greater than approximately 500° C. In some embodiments, the elevated temperature may be in a range of between approximately 100° C. and approximately 300° C.

Figure 12A:
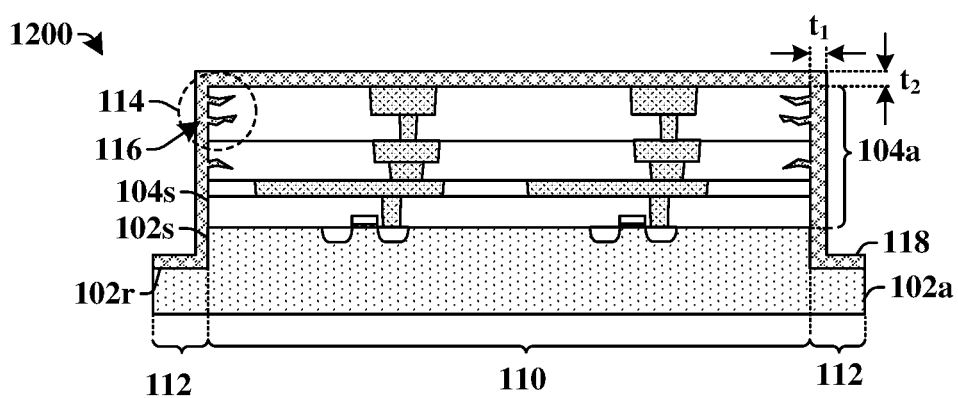

As shown in cross-sectional view 1200 of FIG. 12A, a dielectric protection layer 118 is formed along an outermost sidewall 104s of the first interconnect structure 104a defined by the edge trimming process. In some embodiments, the dielectric protection layer 118 may also be formed onto a sidewall of the first semiconductor substrate 102a, along a recessed surface 102r of the first semiconductor substrate 102a, and/or within recesses 116 of the damaged region 114.

In some embodiments, the dielectric protection layer 118 comprises silicon nitride, silicon oxynitride, silicon carbide, silicon dioxide, hafnium dioxide, tantalum pentoxide, aluminum oxide, zinc peroxide, or the like. The dielectric protection layer 118 has a first thickness $t_1$ along the sidewalls of the first interconnect structure 104a and a second thickness $t_2$ directly over the first interconnect structure 104a. In some embodiments, the first thickness $t_1$ is greater than or equal to approximately 80% of the second thickness $t_2$. In some embodiments, the first thickness $t_1$ is greater than or equal to approximately 90% of the second thickness $t_2$. In some embodiments, the first thickness $t_1$ is between approximately 80% and approximately 100% of the second thickness $t_2$.

In some embodiments, the dielectric protection layer 118 may be exposed to one or more etchants (e.g., a wet etchant used to remove a photoresist used in patterning a BTSV) during subsequent fabrication processes. Therefore, the dielectric protection layer 118 has to have a thickness and/or density that offers a sufficient resistant to etching to protect the first interconnect structure 104a from further damage. In some embodiments, the first thickness $t_1$ of the dielectric protection layer 118 is greater than or equal to approximately 200 Angstroms. A first thickness $t_1$ that is greater than or equal to approximately 200 Angstroms is able to protect the first interconnect structure 104a from subsequent etching processes. In some such embodiments, the first thickness $t_1$ is in a range of between approximately 200 Angstroms and approximately 2000 Angstroms. In other embodiments, the first thickness $t_1$ of the dielectric protection layer 118 may be greater than or equal to approximately 500 Angstroms, greater than or equal to approximately 750 Angstroms, or greater than or equal to approximately 1000 Angstroms. Having a first thickness $t_1$ that is greater than 80% of the second thickness $t_2$ allows for efficient and cost effective deposition of the dielectric protection layer 118 to the first thickness $t_1$ that is able to protect the first interconnect structure 104a from further damage (e.g., to a first thickness $t_1$ of greater than 200 Angstroms).

In some embodiments, the dielectric protection layer 118 may have relatively low wet etch rate to protect the first interconnect structure 104a during subsequent wet etching processes. For example, in some embodiments, the dielectric protection layer 118 may have a wet etch rate of less than approximately 500 Angstroms/minute. In some embodiments, the dielectric protection layer 118 may have a wet etch rate that is less than approximately 350 Å/min when exposed to a wet etchant comprising diluted hydrofluoric acid (e.g., at a ratio of 100:1 $H_2O$ to HF at room temperature).

In some embodiments (shown in cross-sectional view 1200 of FIG. 12A), the dielectric protection layer 118 may be deposited by way of a plasma enhanced atomic layer deposition (PEALD) process, an atomic layer deposition (ALD) process, a high density plasma chemical vapor deposition (HDP-CVD) process, an integrated profile modulation (IPM) deposition process, or a metal organic chemical vapor deposition (MOCVD) process. In some such embodiments, the dielectric protection layer 118 may completely cover the first semiconductor substrate 102a and the first interconnect structure 104a.

In other embodiments (shown in cross-sectional view 1202 of FIG. 12B), the dielectric protection layer 118 may be formed by way of a bevel deposition process. In such embodiments the dielectric protection layer 118 is formed over an outer region of the first semiconductor substrate 102a, but not over a center of the first semiconductor substrate 102a. The resulting dielectric protection layer 118 comprises one or more sidewalls 118s that define an opening 210 over the first interconnect structure 104a.

Figure 13:
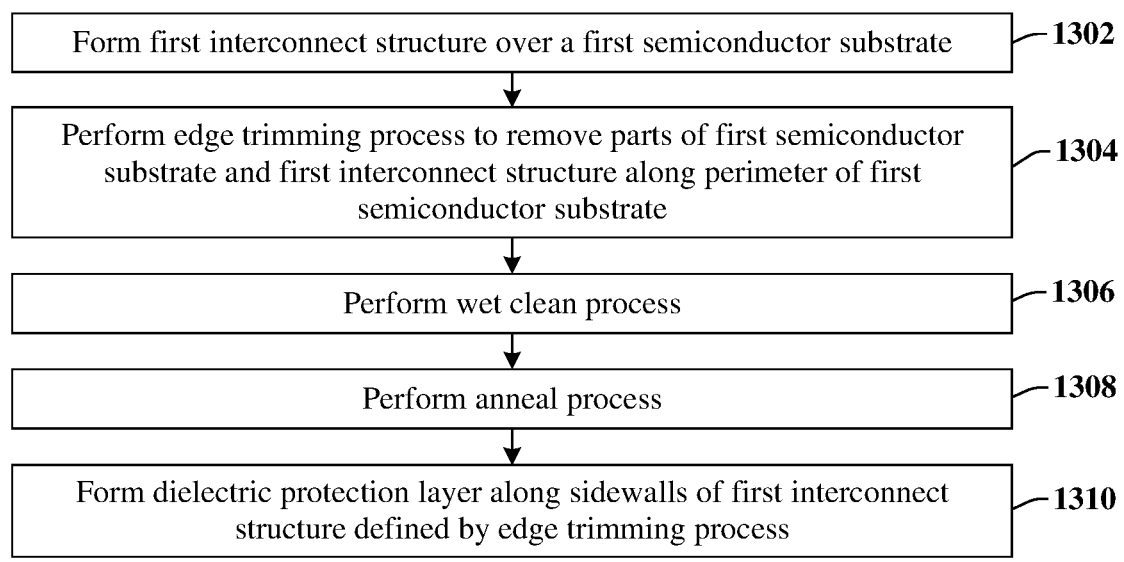
FIG. 13 illustrates a flow diagram of some embodiments of a method of forming an integrated chip structure having a dielectric protection layer.

FIG. 13 illustrates a flow diagram of some embodiments of a method 1300 of forming an integrated chip structure having a dielectric protection layer.

While the methods disclosed herein (e.g., methods 1300, 1800, 2300, and 2800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a first interconnect structure is formed over a first semiconductor substrate. FIG. 8 illustrates a cross-sectional view 800 of some embodiments corresponding to act 1302.

At 1304, an edge trimming process is performed to remove parts of the first semiconductor substrate and the first interconnect structure along a perimeter of the first semiconductor substrate. FIG. 9 illustrates a cross-sectional view 900 of some embodiments corresponding to act 1304.

At 1306, a wet cleaning process is performed on the first semiconductor substrate and the first interconnect structure. FIG. 10 illustrates a cross-sectional view 1000 of some embodiments corresponding to act 1306.

At 1308, an anneal process is performed on the first semiconductor substrate and the first interconnect structure. FIG. 11 illustrates a cross-sectional view 1100 of some embodiments corresponding to act 1308.

Figure 12B:
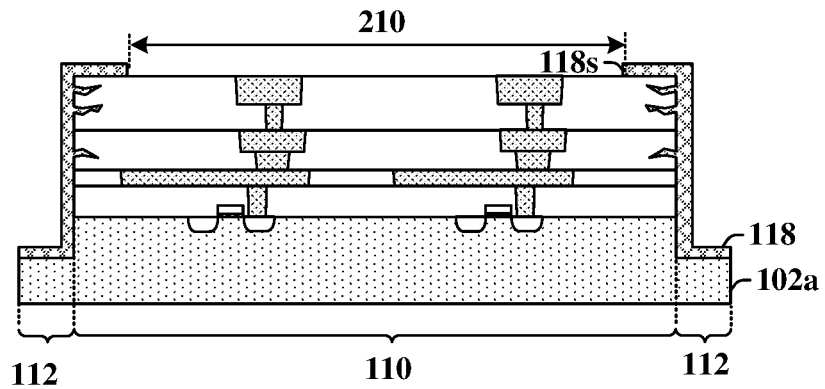

At 1310, a dielectric protection layer is formed along sidewalls of first interconnect structure defined by the edge trimming process. FIG. 12A illustrates a cross-sectional view 1200 of some embodiments corresponding to act 1310. FIG. 12B illustrates a cross-sectional view 1202 of some alternative embodiments corresponding to act 1310.

FIGS. 14-17D illustrate cross-sectional views 1400-1706 of some embodiments of a method of forming a multi-dimensional integrated chip structure having a dielectric protection layer. Although FIGS. 14-17D are described in relation to a method, it will be appreciated that the structures disclosed in FIGS. 14-17D are not limited to such a method, but instead may stand alone as structures independent of the method. Furthermore, although the method of FIGS. 14-17D is illustrated as a wafer-to-wafer (W2W) bonding process it will be appreciated that the method may be applied to a chip-to-wafer (C2W) bonding process.

Figure 14:
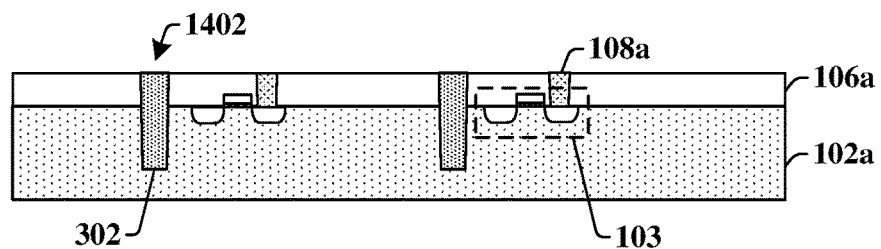

As shown in cross-sectional view 1400 of FIG. 14, one or more transistor devices 103 are formed within a first semiconductor substrate 102a. A conductive contact 108a is formed within a first ILD layer 106a formed over the first semiconductor substrate 102a. The conductive contact 108a is coupled to one or more of the transistor devices 103. In some embodiments, the first semiconductor substrate 102a and the first ILD layer 106a may be etched to define a TSV opening 1402 extending into the first semiconductor substrate 102a. In such embodiments, a conductive material may be formed within the TSV opening 1402 followed by a planarization process to define a TSV 302.

Figure 15:
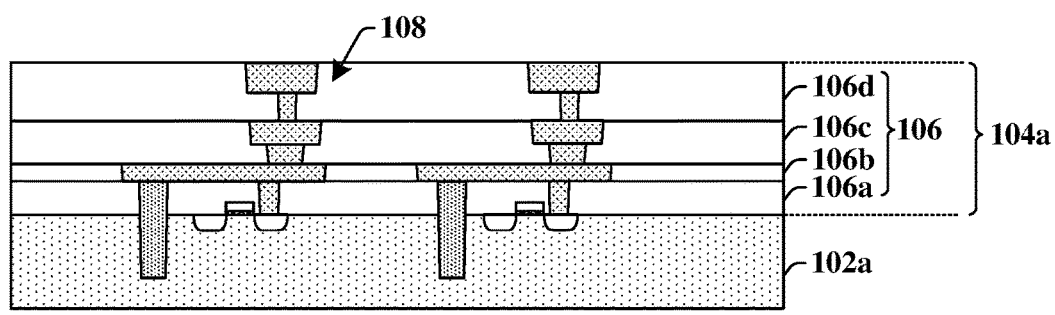

As shown in cross-sectional view 1500 of FIG. 15, one or more additional ILD layers 106b-106d are formed over the first ILD layer 106a to define a dielectric structure 106 over the first semiconductor substrate 102a. One or more interconnect layers 108 are formed within the one or more additional ILD layers 106b-106d to define a first interconnect structure 104a.

FIGS. 16A-16D illustrate some embodiments of an edge trimming process and a bonding process that form a multi-tier semiconductor structure.

As shown in cross-sectional view 1600 of FIG. 16A, an edge trimming process is performed to remove parts of the first semiconductor substrate 102a and the first interconnect structure 104a along a perimeter of the first semiconductor substrate 102a. In some embodiments, the edge trimming process may be performed by bringing a blade 902 into contact with the first semiconductor substrate 102a and the first interconnect structure 104a along a closed loop path.

As shown in cross-sectional view 1602 of FIG. 16B, a dielectric protection layer 118 is formed along sidewalls of the first interconnect structure 104a defined by the edge trimming process. In some embodiments, the dielectric protection layer 118 may also be formed onto sidewalls of the first semiconductor substrate 102a and/or along a recessed surface of the first semiconductor substrate 102a defined by the edge trimming process.

As shown in cross-sectional view 1604 of FIG. 16C, the first semiconductor substrate 102a is bonded to a second semiconductor substrate 102b to form a multi-tier semiconductor structure having a first tier 202a and a second tier 202b. In some embodiments, the first semiconductor substrate 102a is bonded to the second semiconductor substrate 102b by way of the dielectric protection layer 118. In other embodiments (not shown), the first semiconductor substrate 102a may be bonded to the second semiconductor substrate 102b by way of an additional bonding region.

As shown in cross-sectional view 1606 of FIG. 16D, the first semiconductor substrate 102a is thinned. In various embodiments, the first semiconductor substrate 102a may be thinned by etching and/or mechanical grinding a back-side of the first semiconductor substrate 102a along line 1608. In some embodiments, the first semiconductor substrate 102a may be thinned by a first grinding process, a subsequent second grinding process, and a chemical mechanical polishing (CMP) process. In some embodiments, the first grinding process may achieve a first surface roughness, the second grinding process may achieve a second surface roughness that is less than the first surface roughness, and the CMP process may achieve a third surface roughness that is less than the second surface roughness.

FIGS. 17A-17D illustrate some alternative embodiments of an edge trimming process and a bonding process that form a multi-tier semiconductor structure.

Figure 17A:
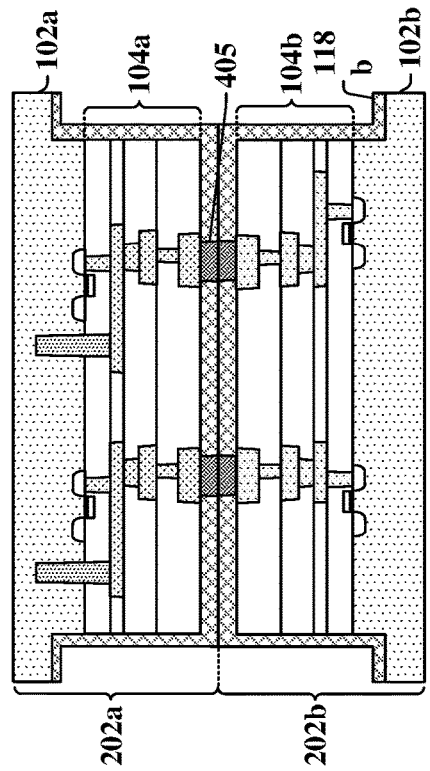

As shown in cross-sectional view 1700 of FIG. 17A, an edge trimming process is performed to remove parts of the first semiconductor substrate 102a and the first interconnect structure 104a along a perimeter of the first semiconductor substrate 102a.

Figure 17C:
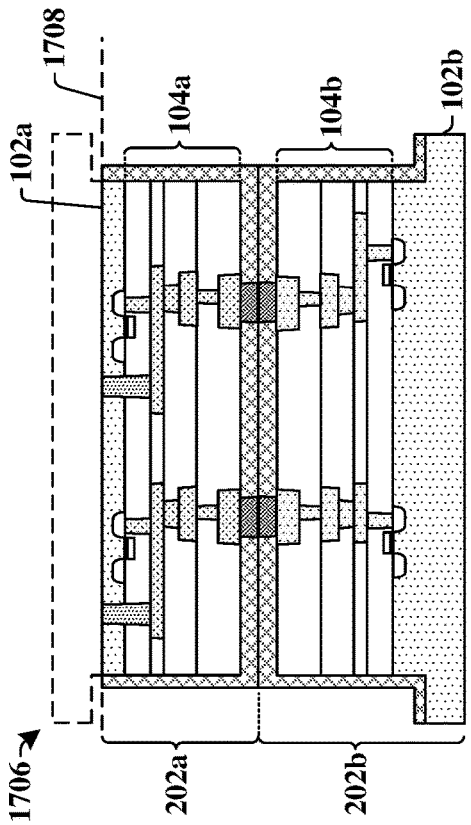
Figure 17B:
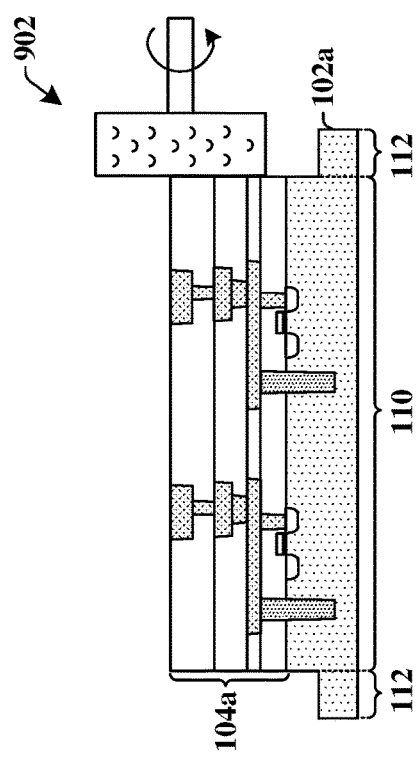

As shown in cross-sectional view 1702 of FIG. 17B, a first dielectric protection layer 118a is formed along sidewalls of the first interconnect structure 104a defined by the edge trimming process. In some embodiments, the first dielectric protection layer 118a may also be formed onto sidewalls of the first semiconductor substrate 102a and/or along a recessed surface of the first semiconductor substrate 102a defined by the edge trimming process.

As shown in cross-sectional view 1704 of FIG. 17C, the first semiconductor substrate 102a is bonded to a second semiconductor substrate 102b to form a multi-tier semiconductor structure having a first tier 202a and a second tier 202b. In some embodiments, a second edge trimming process may be performed on the second semiconductor substrate 102b prior to the bond. In such embodiments, a second dielectric protection layer 118b may be formed over the second semiconductor substrate 102b prior to the bonding.

In some embodiments, prior to bonding, one or more conductive features 405 may be formed to extend through the first dielectric protection layer 118a and the second dielectric protection layer 118b. In some such embodiments, the first semiconductor substrate 102a is bonded to the second semiconductor substrate 102b by way of the first dielectric protection layer 118a and the second dielectric protection layer 118b. In other embodiments (not shown), the first semiconductor substrate 102a is bonded to the second semiconductor substrate 102b by way of a bonding region (e.g., a hybrid bonding region or a dielectric bonding region).

Figure 17D:
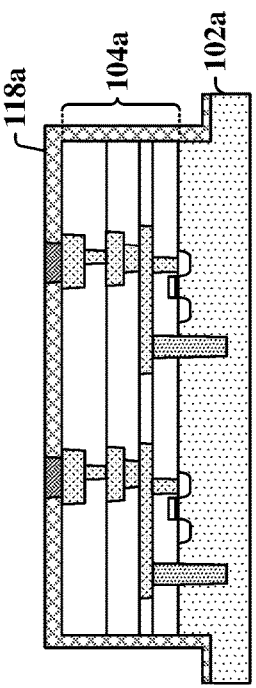

As shown in cross-sectional view 1706 of FIG. 17D, the first semiconductor substrate 102a is thinned along line 1708.

Figure 18:
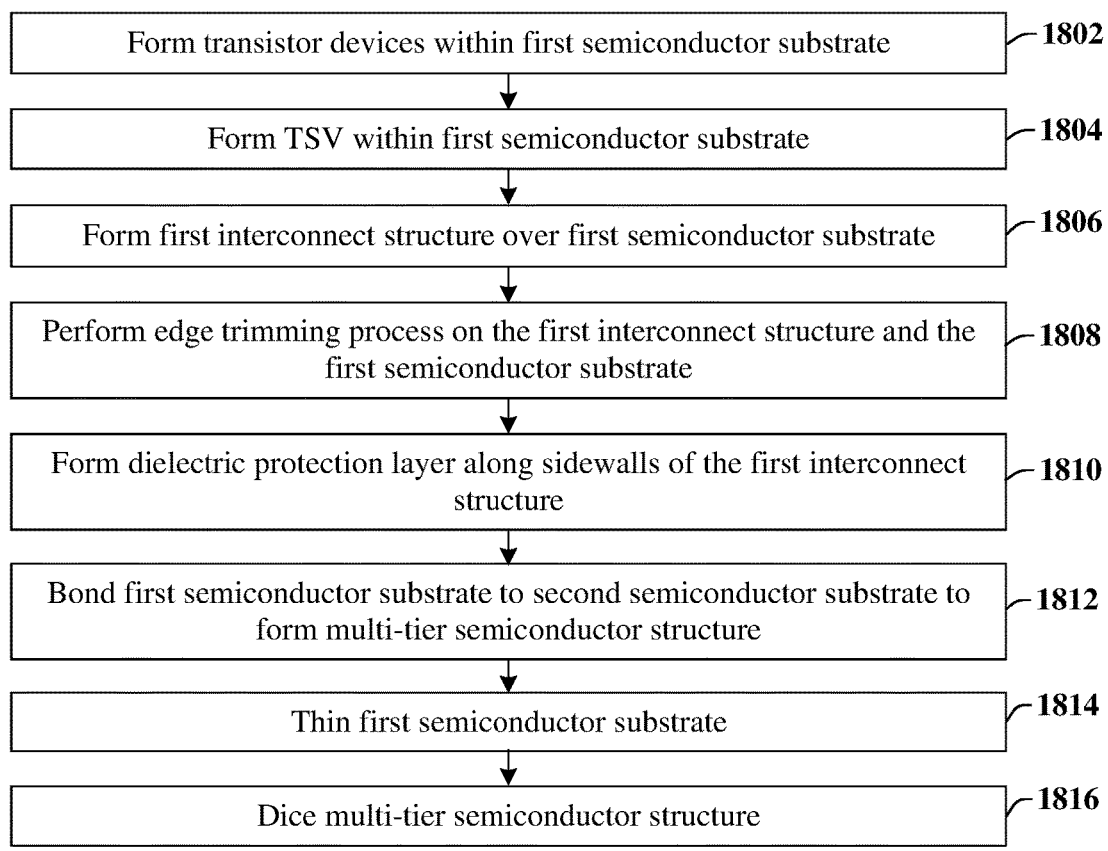
FIG. 18 illustrates a flow diagram of some embodiments of a method of forming a multi-dimensional integrated chip structure having a dielectric protection layer.

FIG. 18 illustrates a flow diagram of some embodiments of a method 1800 of forming a multi-tier semiconductor structure having a dielectric protection layer.

At 1802, one or more transistor devices are formed within a first semiconductor substrate. FIG. 14 illustrates a cross-sectional view 1400 of some embodiments corresponding to act 1802.

At 1804, a through-substrate-via (TSV) is formed within the first semiconductor substrate. FIG. 14 illustrates a cross-sectional view 1400 of some embodiments corresponding to act 1804.

At 1806, a first interconnect structure is formed over the first semiconductor substrate. FIG. 15 illustrates a cross-sectional view 1500 of some embodiments corresponding to act 1806.

At 1808, an edge trimming process is performed on the first interconnect structure and the first semiconductor substrate. FIG. 16A illustrates a cross-sectional view 1600 of some embodiments corresponding to act 1808. FIG. 17A illustrates a cross-sectional view 1700 of some alternative embodiments corresponding to act 1808.

At 1810, a dielectric protection layer is formed along sidewalls of the first interconnect structure. FIG. 16B illustrates a cross-sectional view 1602 of some embodiments corresponding to act 1810. FIG. 17B illustrates a cross-sectional view 1702 of some alternative embodiments corresponding to act 1810.

At 1812, the first semiconductor substrate is bonded to a second semiconductor substrate to form a multi-tier semiconductor structure. FIG. 16C illustrates a cross-sectional view 1604 of some embodiments corresponding to act 1812. FIG. 17C illustrates a cross-sectional view 1704 of some alternative embodiments corresponding to act 1812.

At 1814, the first semiconductor substrate is thinned. FIG. 16D illustrates a cross-sectional view 1606 of some embodiments corresponding to act 1814. FIG. 17D illustrates a cross-sectional view 1706 of some alternative embodiments corresponding to act 1814.

At 1816, the multi-tier semiconductor structure is diced to form a plurality of multi-dimensional integrated chips.

FIGS. 19-22H illustrate cross-sectional views 1900-2216 of some additional embodiments of a method of forming a multi-dimensional integrated chip structure having a dielectric protection layer. Although FIGS. 19-22H are described in relation to a method, it will be appreciated that the structures disclosed in FIGS. 19-22H are not limited to such a method, but instead may stand alone as structures independent of the method. Furthermore, although the method of FIGS. 19-22H is illustrated as a wafer-to-wafer (W2W) bonding process it will be appreciated that the method may be applied to a chip-to-wafer (C2W) bonding process.

Figure 19:
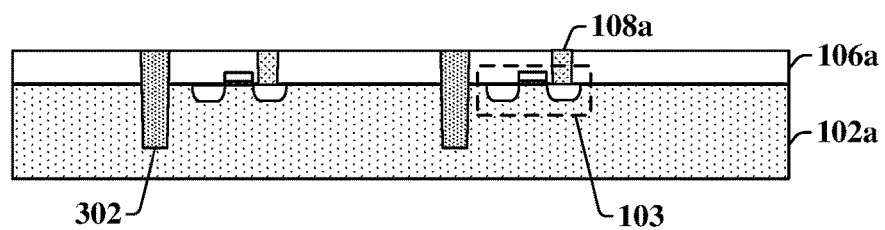
FIGS. 19-22H illustrate cross-sectional views of some additional embodiments of a method of forming a multi-dimensional integrated chip structure having a dielectric protection layer.

As shown in cross-sectional view 1900 of FIG. 19, one or more transistor devices 103 are formed within a first semiconductor substrate 102a. A conductive contact 108a is formed within a first ILD layer 106a formed over the first semiconductor substrate 102a. In some embodiments, a TSV 302 may be subsequently formed within the first semiconductor substrate 102a.

Figure 20:
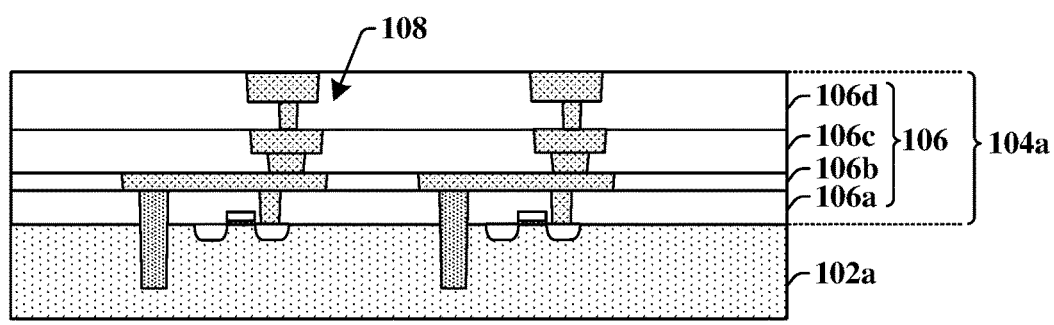

As shown in cross-sectional view 2000 of FIG. 20, one or more additional ILD layers 106b-106d are formed over the first ILD layer 106a to define a dielectric structure 106 over the first semiconductor substrate 102a. One or more interconnect layers 108 are formed within the one or more additional ILD layers 106b-106d to define a first interconnect structure 104a.

FIGS. 21A-21D illustrate cross-sectional views of some embodiments of an edge trimming process and a bonding process that form a multi-tier semiconductor structure.

Figure 21A:
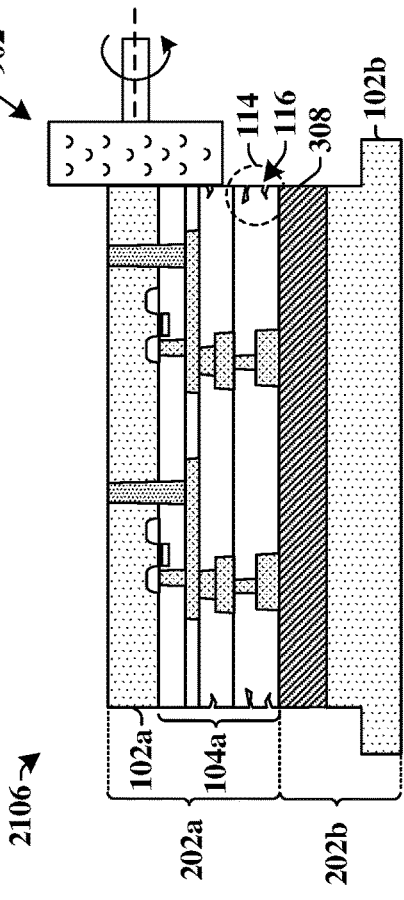

As shown in cross-sectional view 2100 of FIG. 21A, the first semiconductor substrate 102a is bonded to a second semiconductor substrate 102b to form a multi-tier semiconductor structure having a first tier 202a and a second tier 202b. In some embodiments, the first semiconductor substrate 102a is bonded to the second semiconductor substrate 102b by way of a bonding region 308.

Figure 21B:
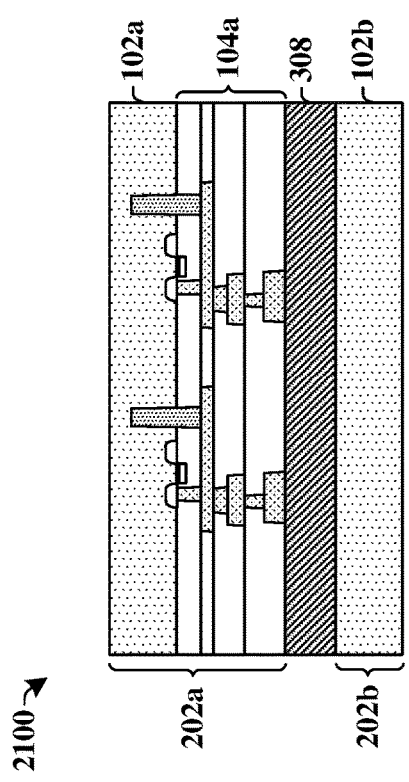

As shown in cross-sectional view 2102 of FIG. 21B, the first semiconductor substrate 102a is thinned. In various embodiments, the first semiconductor substrate 102a may be thinned by etching and/or mechanical grinding a back-side of the first semiconductor substrate 102a along line 2104.

Figure 21C:
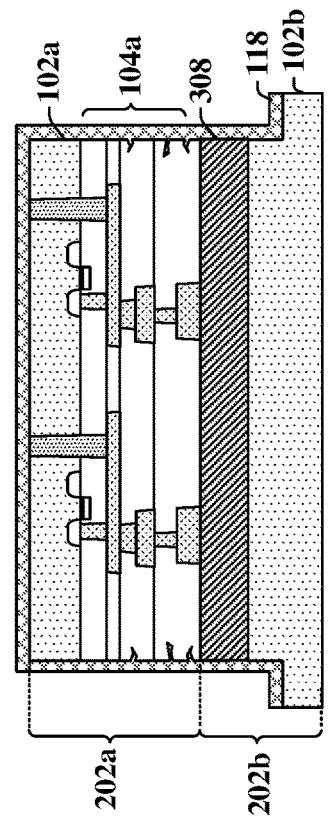

As shown in cross-sectional view 2106 of FIG. 21C, an edge trimming process is performed to remove parts of the first semiconductor substrate 102a, the second semiconductor substrate 102b, and the first interconnect structure 104a along a perimeter of the second semiconductor substrate 102b.

Figure 21D:
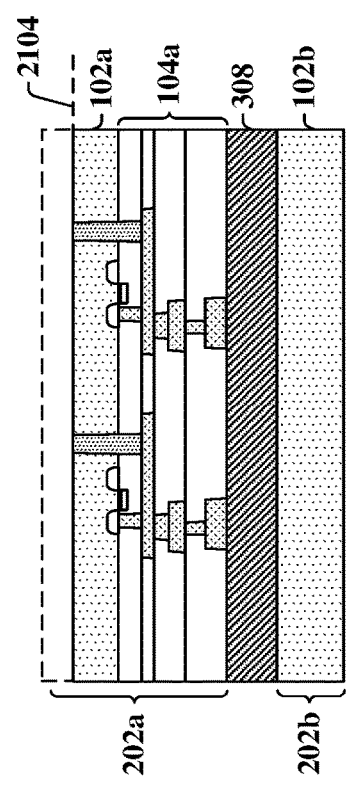

As shown in cross-sectional view 2108 of FIG. 21D, a dielectric protection layer 118 is formed along sidewalls of the first interconnect structure 104a defined by the edge trimming process. In some embodiments, the dielectric protection layer 118 may also be formed onto sidewalls of the first semiconductor substrate 102a, sidewalls of the second semiconductor substrate 102b, and/or along a recessed surface of the second semiconductor substrate 102b.

FIGS. 22A-22H illustrate some additional embodiments of an edge trimming process and a bonding process that form a multi-tier semiconductor structure.

As shown in cross-sectional view 2200 of FIG. 22A, a first plurality of conductive bond features 404a are formed within a first dielectric layer 406a formed over the first interconnect structure 104a.

As shown in cross-sectional view 2202 of FIG. 22B, the first semiconductor substrate 102a is bonded to a second semiconductor substrate 102b to define a multi-tier semiconductor structure comprising a first tier 202a and a second tier 202b. In some embodiments, the first semiconductor substrate 102a is bonded to the second semiconductor substrate 102b by a first hybrid bonding region 402a formed by bringing the first plurality of conductive bond features 404a within the first dielectric layer 406a into contact with a second plurality of conductive bond features 404b within a second dielectric layer 406b.

As shown in cross-sectional view 2204 of FIG. 22C, a first edge trimming process is performed to remove parts of the multi-tier semiconductor structure along a perimeter of the second semiconductor substrate 102b.

As shown in cross-sectional view 2206 of FIG. 22D, a first dielectric protection layer 118a is formed along sidewalls of the first tier 202a and the second tier 202b defined by the first edge trimming process. In some embodiments, the first dielectric protection layer 118a may also be formed onto a recessed surface of the second semiconductor substrate 102b.

Figure 22F:
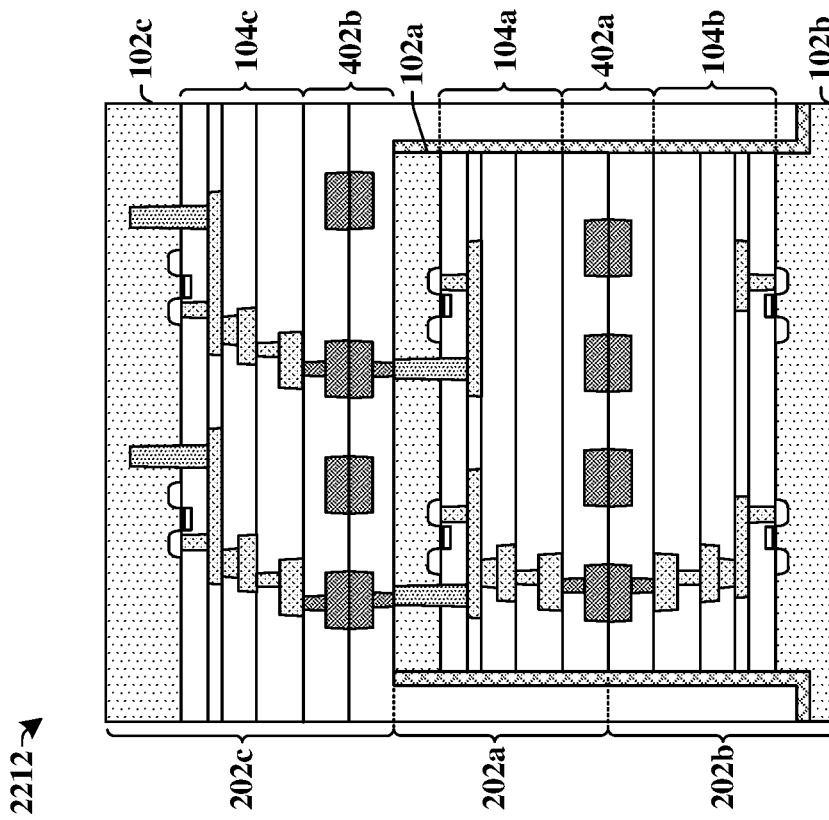
Figure 22E:
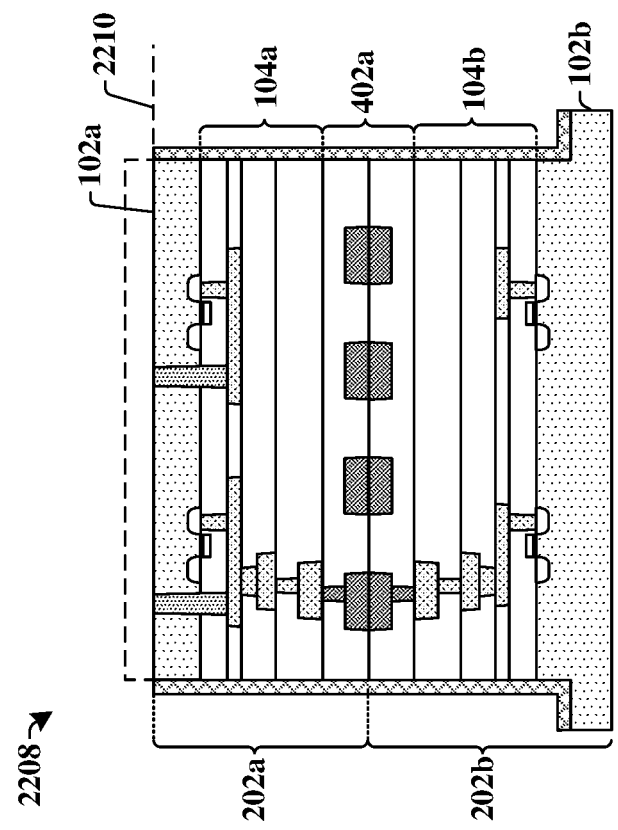

As shown in cross-sectional view 2208 of FIG. 22E, the first semiconductor substrate 102a may be thinned along line 2210.

As shown in cross-sectional view 2212 of FIG. 22F, a third semiconductor substrate 102c and a third interconnect structure 104c are bonded to a second semiconductor substrate 102b by way of a second hybrid bonding region 402b to form a third tier 202c of the multi-tier semiconductor structure.

As shown in cross-sectional view 2214 of FIG. 22G, a second edge trimming process is performed to remove parts of the third semiconductor substrate 102c and the third interconnect structure 104c. In some embodiments, the second edge trimming process may also remove parts of the first dielectric protection layer 118a.

As shown in cross-sectional view 2214 of FIG. 22H, a second dielectric protection layer 118b is formed along sidewalls of the first tier 202a, the second tier 202b, and the third tier 202c defined by the second edge trimming process. After formation of the second dielectric protection layer 118b, a second thinning process may be performed along line 2218 to reduce a thickness of the third semiconductor substrate 102c.

Figure 23:
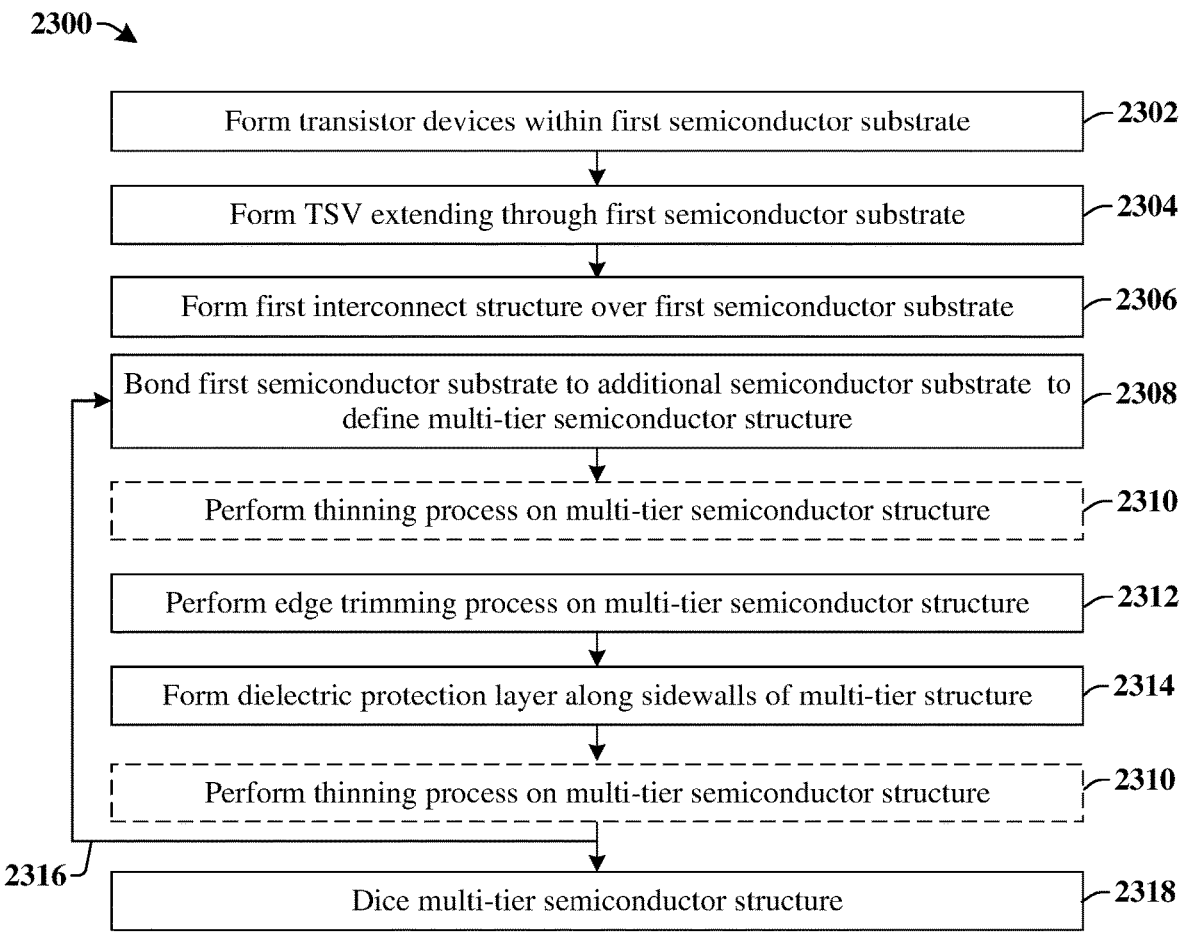
FIG. 23 illustrates a flow diagram of some additional embodiments of a method of forming a multi-dimensional integrated chip structure having a dielectric protection layer.

FIG. 23 illustrates a flow diagram of some additional embodiments of a method 2300 of forming a multi-tier semiconductor structure having a dielectric protection layer.

At 2302, one or more transistor devices are formed within a first semiconductor substrate. FIG. 19 illustrates a cross-sectional view 1900 of some embodiments corresponding to act 2302.

At 2304, a through-substrate-via (TSV) is formed within the first semiconductor substrate. FIG. 19 illustrates a cross-sectional view 1900 of some embodiments corresponding to act 2304.

At 2306, a first interconnect structure is formed over the first semiconductor substrate. FIG. 20 illustrates a cross-sectional view 2000 of some embodiments corresponding to act 2306.

At 2308, the first semiconductor substrate is bonded to a second semiconductor substrate to define a multi-tier semiconductor structure. FIG. 21A illustrates a cross-sectional view 2100 of some embodiments corresponding to act 2308. FIGS. 22A-22B illustrate cross-sectional views 2200-2202 of some alternative embodiments corresponding to act 2308.

At 2310, a thinning process is performed on the multi-tier semiconductor structure. In some embodiments, the thinning process may be performed prior to acts 2312-2314. FIG. 21B illustrates a cross-sectional view 2102 of some such embodiments. In some embodiments, the thinning process may be performed after to acts 2312-2314. FIG. 22E illustrates a cross-sectional view 2208 of some such embodiments.

At 2312, an edge trimming process is performed on the multi-tier semiconductor structure. FIG. 21C illustrates a cross-sectional view 2106 of some embodiments corresponding to act 2312. FIG. 22C illustrates a cross-sectional view 2204 of some alternative embodiments corresponding to act 2312.

At 2314, a dielectric protection layer is formed along sidewalls of the multi-tier semiconductor structure. FIG. 21D illustrates a cross-sectional view 2108 of some embodiments corresponding to act 2314. FIG. 22D illustrates a cross-sectional view 2206 of some alternative embodiments corresponding to act 2314.

In some embodiments, acts 2308-2314 may be repeated (along line 2316) to form a multi-dimensional semiconductor structure having more than two tiers. FIGS. 22F-22H illustrates cross-sectional views 2212-2216 of some embodiments corresponding to a repeat of acts 2308-2314.

At 2318, the multi-tier semiconductor structure is diced to form a plurality of multi-dimensional integrated chips.

FIGS. 24-27H illustrate cross-sectional views 2400-2720 of some additional embodiments of a method of forming a multi-dimensional integrated chip structure having a dielectric protection layer. Although FIGS. 24-27H are described in relation to a method, it will be appreciated that the structures disclosed in FIGS. 24-27H are not limited to such a method, but instead may stand alone as structures independent of the method.

Figure 24:
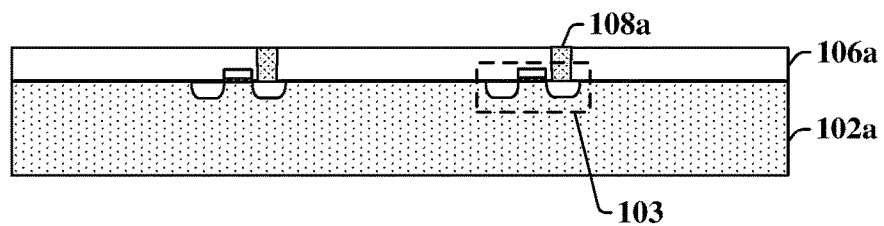
FIGS. 24-27H illustrate cross-sectional views of some additional embodiments of a method of forming a multi-dimensional integrated chip structure having a dielectric protection layer.

As shown in cross-sectional view 2400 of FIG. 24, one or more transistor devices 103 are formed within a first semiconductor substrate 102a. A conductive contact 108a is formed within a first ILD layer 106a formed over the first semiconductor substrate 102a.

Figure 25:
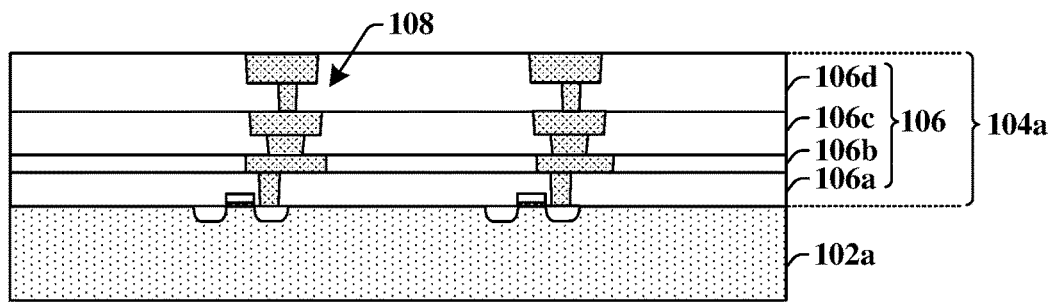

As shown in cross-sectional view 2500 of FIG. 25, one or more additional ILD layers 106b-106d are formed over the first ILD layer 106a to define a dielectric structure 106 over the first semiconductor substrate 102a. One or more interconnect layers 108 are formed within the one or more additional ILD layers 106b-106d to define a first interconnect structure 104a.

FIGS. 26A-26H illustrate cross-sectional views of some embodiments of an edge trimming process and a bonding process that form a multi-tier semiconductor structure.

Figure 26A:
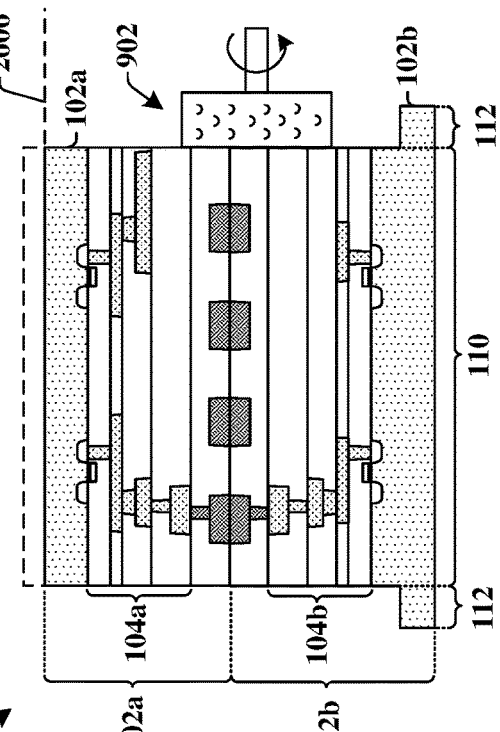

As shown in cross-sectional view 2600 of FIG. 26A, a first plurality of conductive bond features 404a are formed within a first dielectric layer 406a formed over the first interconnect structure 104a.

Figure 26B:
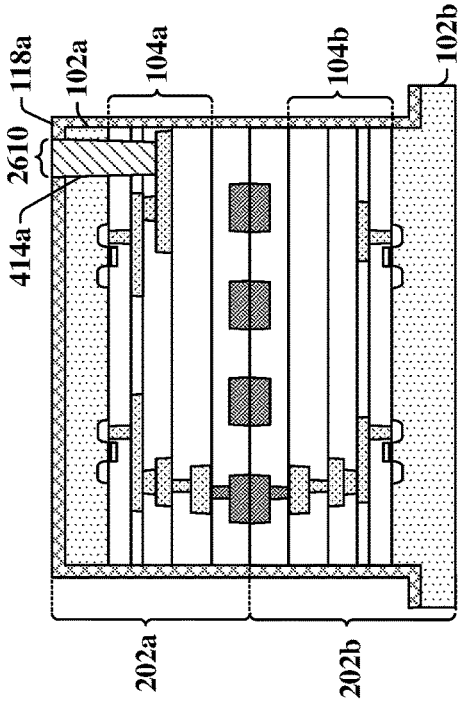

As shown in cross-sectional view 2602 of FIG. 26B, the first semiconductor substrate 102a is bonded to a second semiconductor substrate 102b to define a multi-tier semiconductor structure comprising a first tier 202a and a second tier 202b.

Figure 26C:
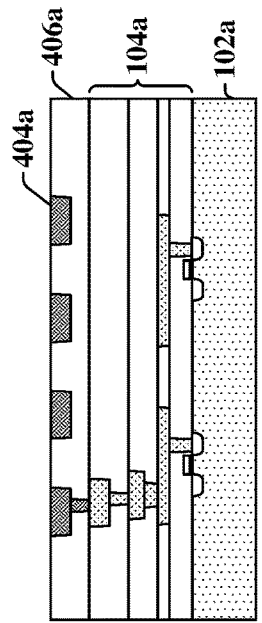

As shown in cross-sectional view 2604 of FIG. 26C, a first edge trimming process is performed to remove parts of the first semiconductor substrate 102a and the first interconnect structure 104a along a perimeter of the second semiconductor substrate 102b. In some embodiments, a first thinning process may also be performed to thin the first semiconductor substrate 102a along line 2606.

Figure 26D:
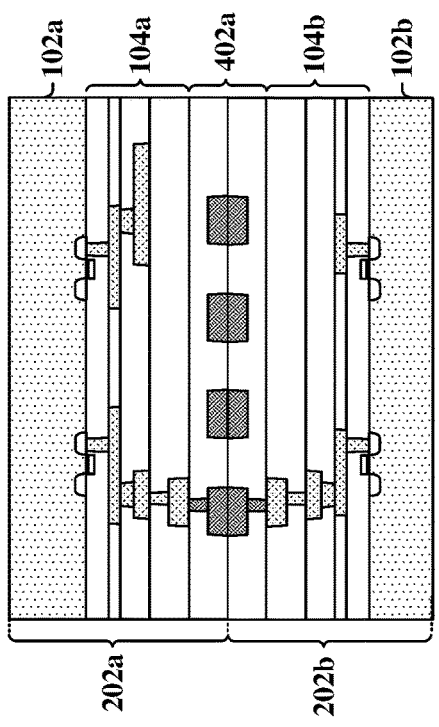

As shown in cross-sectional view 2608 of FIG. 26D, a first dielectric protection layer 118a is formed along sidewalls of the first tier 202a and the second tier 202b defined by the first edge trimming process. In some embodiments, the first dielectric protection layer 118a may also be formed onto a recessed surface of the second semiconductor substrate 102b.

After formation of the first dielectric protection layer 118a, a first back-side through substrate via (BTSV) opening 2610 is formed. The first BTSV opening 2610 extends through the first dielectric protection layer 118a and the first semiconductor substrate 102a to an interconnect layer within the first interconnect structure 104a. The first BTSV opening 2610 is subsequently filled with a conductive material to define a first back-side through substrate via (BTSV) 414a.

Figure 26F:
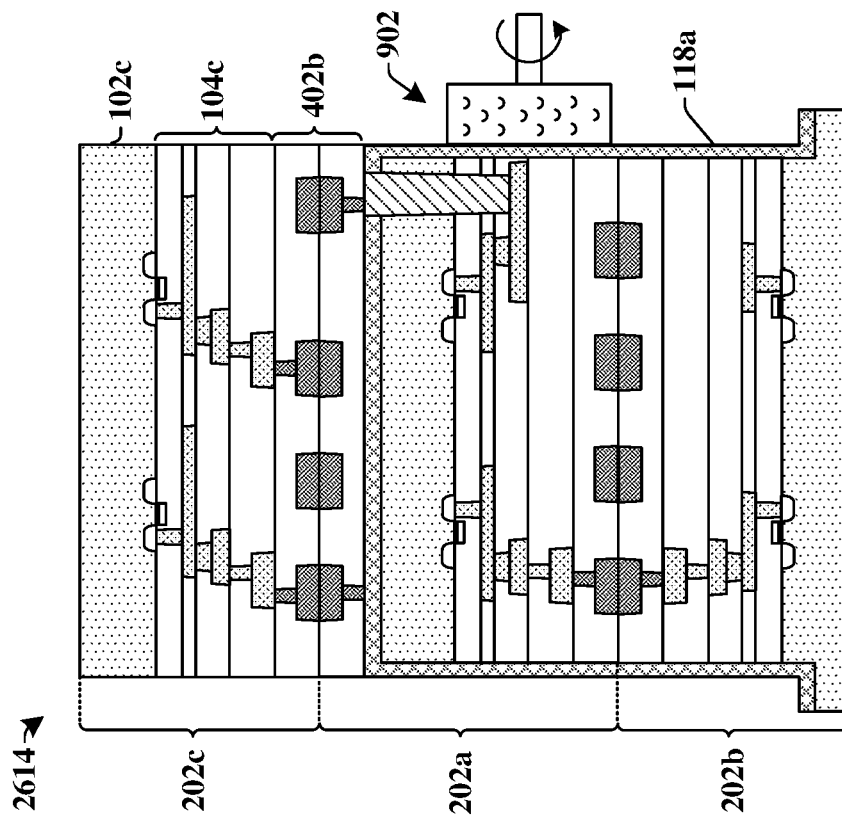
Figure 26E:
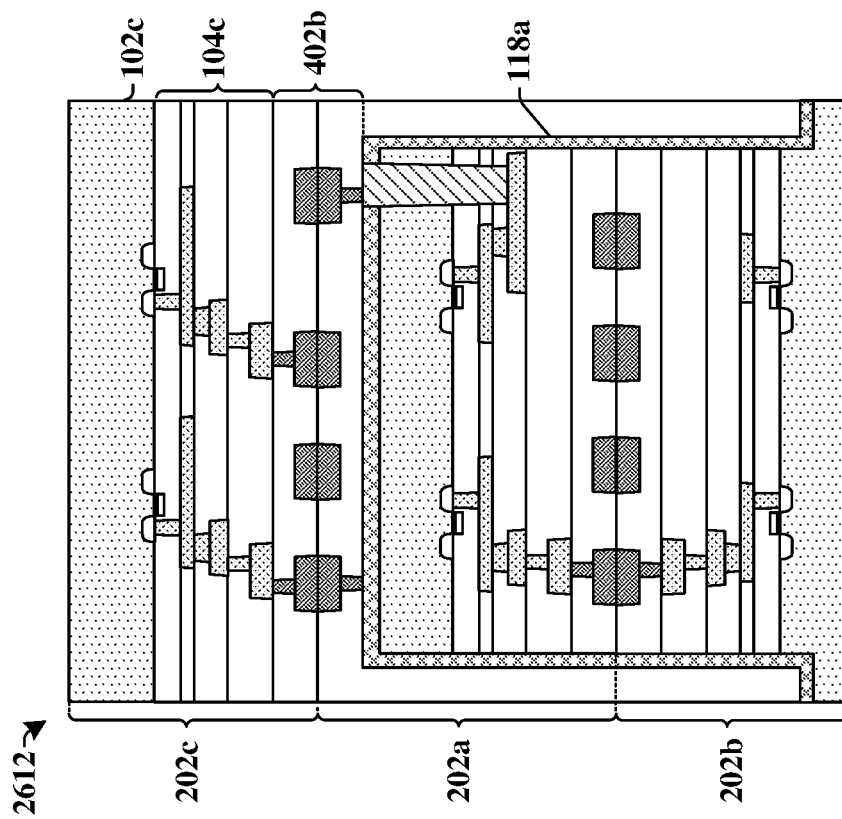

As shown in cross-sectional view 2612 of FIG. 26E, a third semiconductor substrate 102c and a third interconnect structure 104c are bonded to a second semiconductor substrate 102b by way of a second hybrid bonding region 402b to form a third tier 202c of the multi-tier semiconductor structure.

As shown in cross-sectional view 2614 of FIG. 26F, a second edge trimming process is performed to remove parts of the third semiconductor substrate 102c and the third interconnect structure 104c. In some embodiments, the second edge trimming process may also remove parts of the first dielectric protection layer 118a.

Figures 26G, 26H:
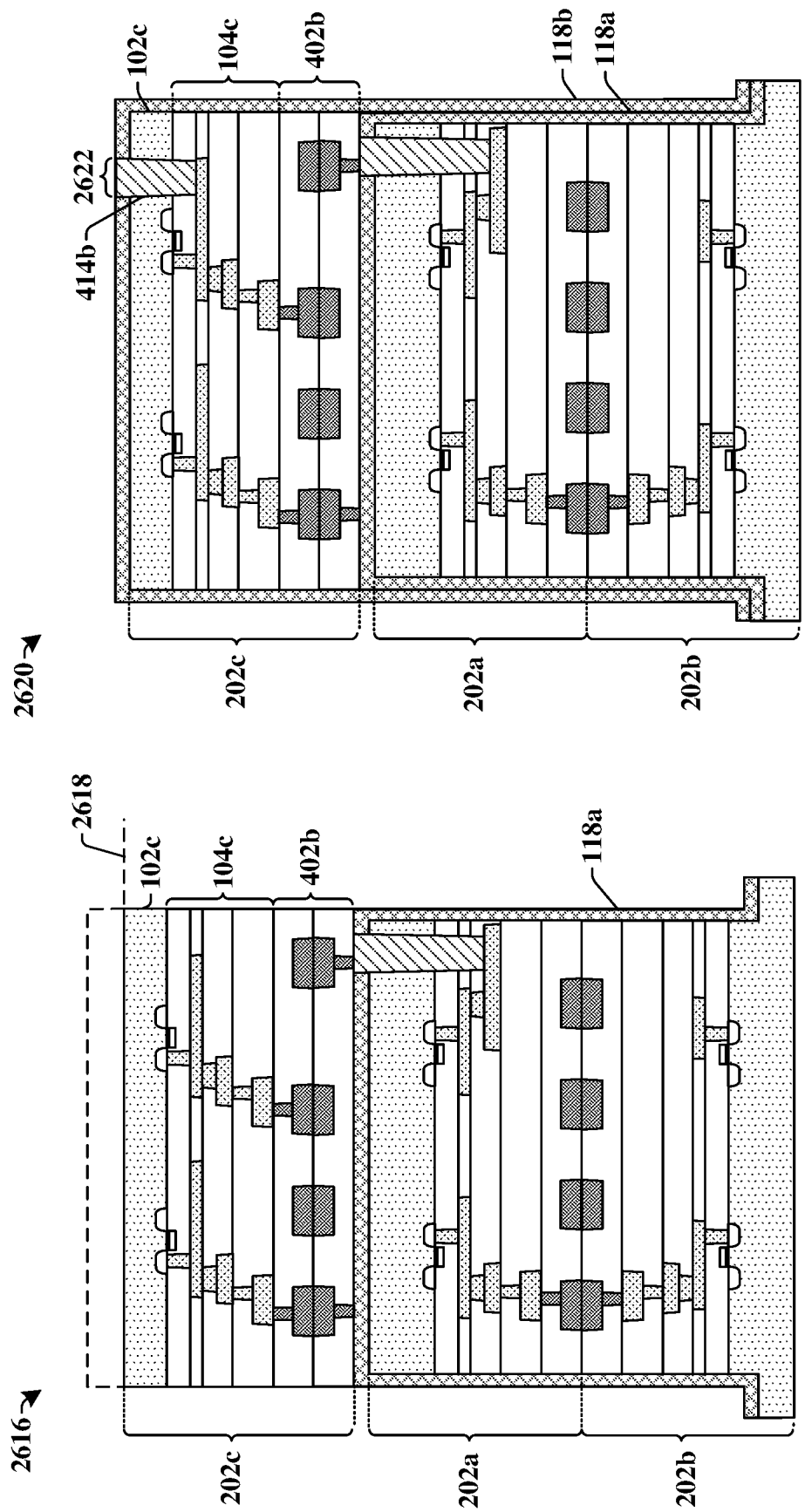

As shown in cross-sectional view 2616 of FIG. 26G, a second thinning process may be performed to thin the third semiconductor substrate 102c along line 2618.

As shown in cross-sectional view 2620 of FIG. 26H, a second dielectric protection layer 118b is formed along sidewalls of the first tier 202a, the second tier 202b, and the third tier 202c defined by the edge trimming process. After formation of the second dielectric protection layer 118b, a second BTSV opening 2622 is formed. The second BTSV opening 2622 extends through the second dielectric protection layer 118b and the third semiconductor substrate 102c to an interconnect layer within the third interconnect structure 104c. The second BTSV opening 2622 is subsequently filled with a conductive material to define a second BTSV 414b.

FIGS. 27A-27H illustrate some additional embodiments of an edge trimming process and a bonding process that form a multi-tier semiconductor structure.

As shown in cross-sectional view 2700 of FIG. 27A, a first dielectric bonding structure 504a is formed over the first interconnect structure 104a.

As shown in cross-sectional view 2702 of FIG. 27B, the first semiconductor substrate 102a is bonded to a second semiconductor substrate 102b by way of a first dielectric bonding region 502a to define a multi-tier semiconductor structure comprising a first tier 202a and a second tier 202b. In some embodiments, the first dielectric bonding structure 504a may contact a second dielectric bonding structure 504b along a first dielectric interface 506a within the first dielectric bonding region 502a.

As shown in cross-sectional view 2704 of FIG. 27C, a first edge trimming process is performed to remove parts of the multi-tier semiconductor structure along a perimeter of the multi-tier semiconductor structure. In some embodiments, a first thinning process may also be performed to thin the first semiconductor substrate 102a along line 2706.

As shown in cross-sectional view 2708 of FIG. 27D, a first dielectric protection layer 118a is formed along sidewalls of the first tier 202a and the second tier 202b defined by the first edge trimming process. In some embodiments, the first dielectric protection layer 118a may also be formed onto a recessed surface of the second semiconductor substrate 102b.

After formation of the first dielectric protection layer 118a, a first BTSV opening 2710 is formed. The first BTSV opening 2710 extends through the first dielectric protection layer 118a, the first semiconductor substrate 102a, and the first dielectric bonding region 502a to an interconnect layer within the second interconnect structure 104b. The first BTSV opening 2710 is subsequently filled with a conductive material to define a first BTSV 508a.

Figure 27F:
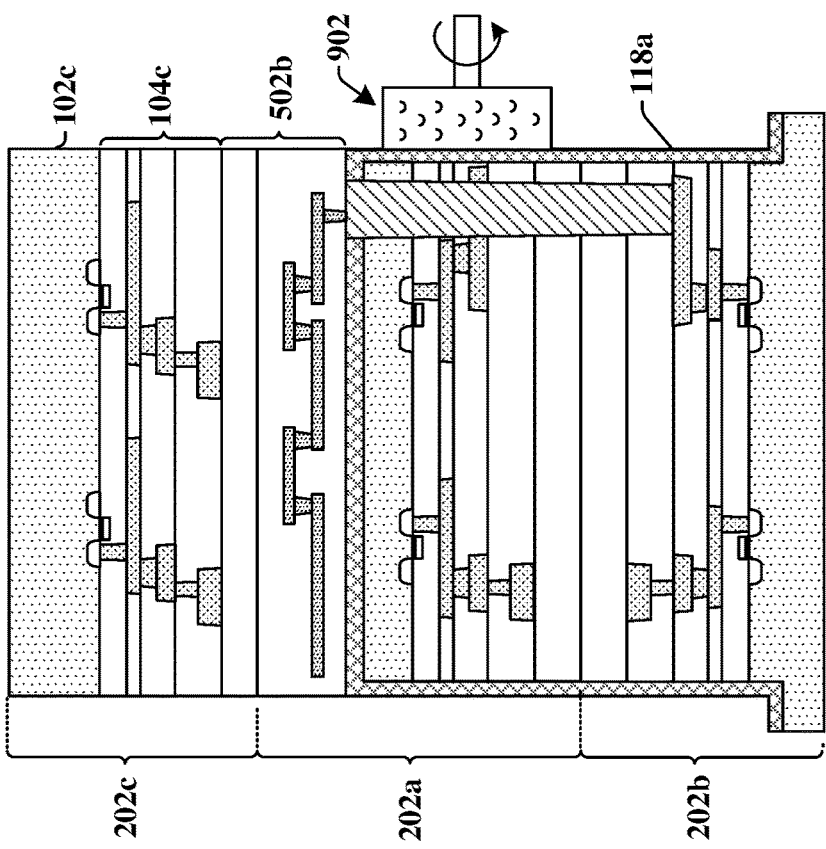
Figure 27E:
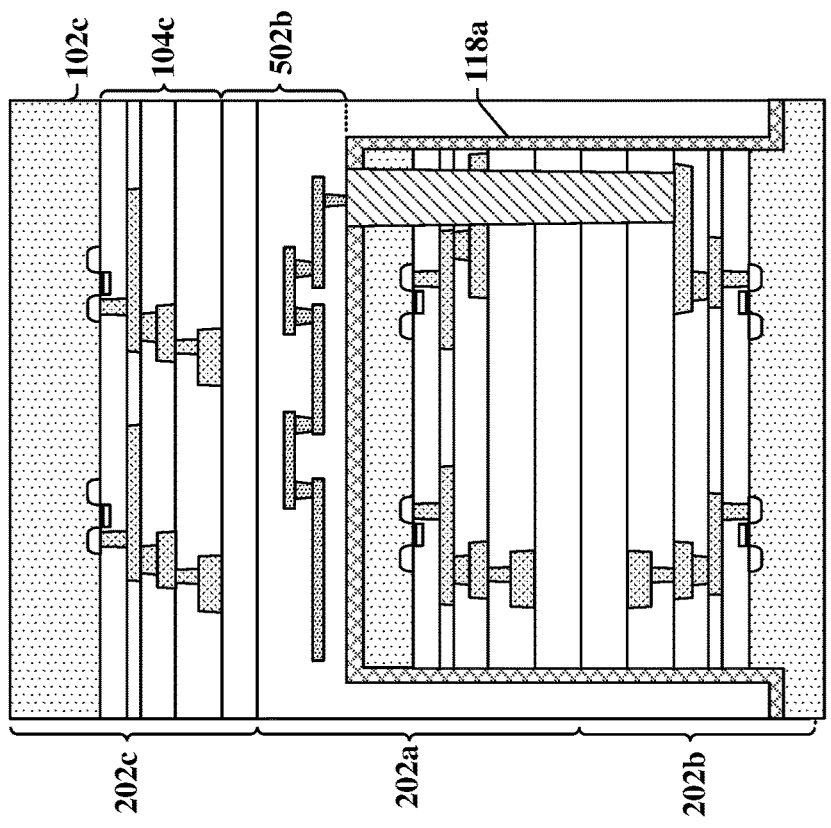

As shown in cross-sectional view 2712 of FIG. 27E, a third semiconductor substrate 102c and a third interconnect structure 104c are bonded to a second semiconductor substrate 102b by way of a second dielectric bonding region 502b to form a third tier 202c on the multi-tier semiconductor structure.

As shown in cross-sectional view 2714 of FIG. 27F, a second edge trimming process is performed to remove parts of the third semiconductor substrate 102c and the third interconnect structure 104c. In some embodiments, the second edge trimming process may also remove parts of the first dielectric protection layer 118a.

As shown in cross-sectional view 2716 of FIG. 27G, a second thinning process may be performed to thin the third semiconductor substrate 102c along line 2718.

As shown in cross-sectional view 2720 of FIG. 27H, a second dielectric protection layer 118b is formed along sidewalls of the first tier 202a, the second tier 202b, and the third tier 202c defined by the edge trimming process. After formation of the second dielectric protection layer 118b, a second BTSV opening 2722 is formed. The second BTSV opening 2722 extends through the second dielectric protection layer 118b and the third semiconductor substrate 102c to an interconnect layer within the third interconnect structure 104c. The second BTSV opening 2722 is subsequently filled with a conductive material to define a second BTSV 508b.

Figure 28:
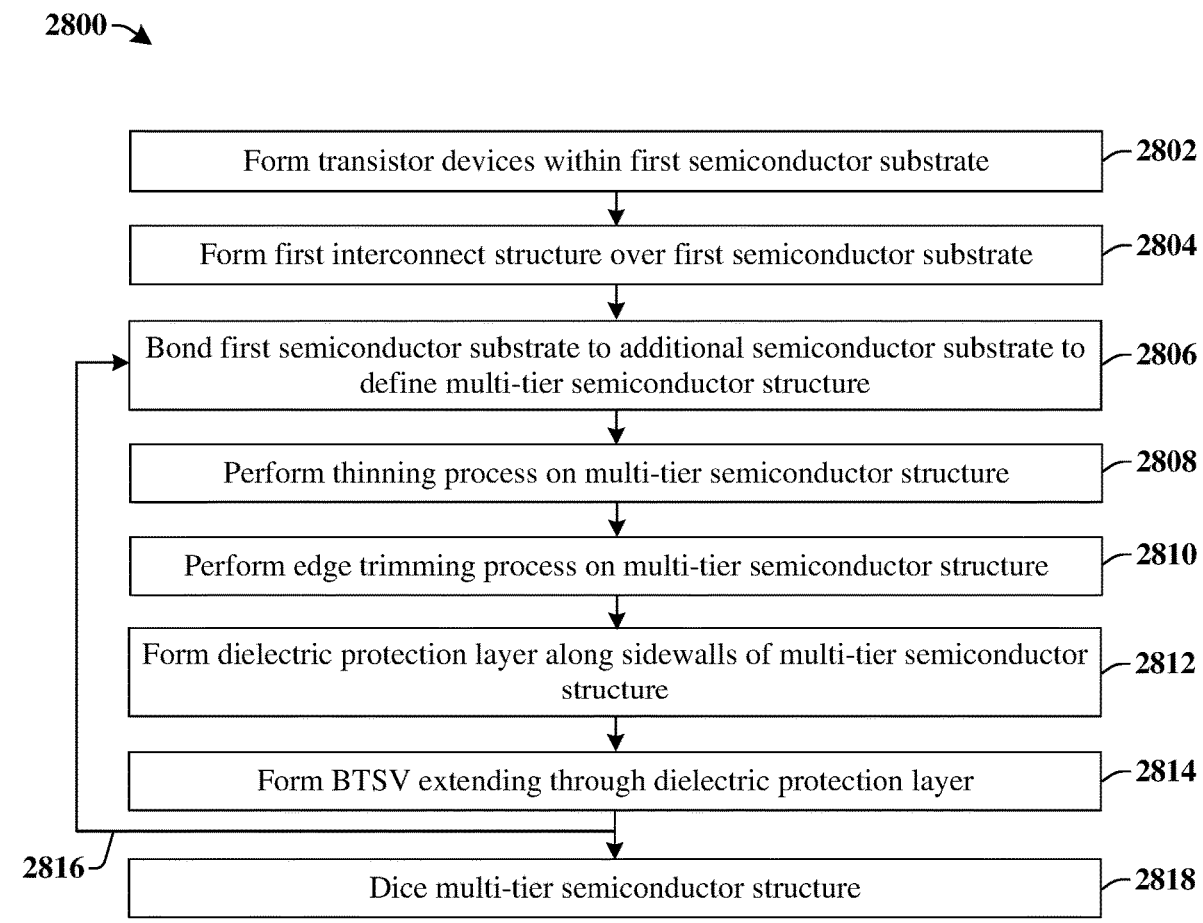
FIG. 28 illustrates a flow diagram of some additional embodiments of a method of forming a multi-dimensional integrated chip structure having a dielectric protection layer.

FIG. 28 illustrates a flow diagram of some additional embodiments of a method 2800 of forming a multi-dimensional integrated chip structure having a dielectric protection layer.

At 2802, one or more transistor devices are formed within a first semiconductor substrate. FIG. 24 illustrates a cross-sectional view 2400 of some embodiments corresponding to act 2802.

At 2804, a first interconnect structure is formed over the first semiconductor substrate. FIG. 25 illustrates a cross-sectional view 2500 of some embodiments corresponding to act 2804.

At 2806, the first semiconductor substrate is bonded to an additional semiconductor substrate to define a multi-tier semiconductor structure. FIGS. 26A-26B illustrate cross-sectional views of some embodiments corresponding to act 2806. FIGS. 27A-27B illustrate cross-sectional views of some alternative embodiments corresponding to act 2806.

At 2808, a thinning process is performed on the multi-tier semiconductor structure. FIG. 26C illustrates a cross-sectional view 2604 of some embodiments corresponding to act 2808. FIG. 27C illustrates a cross-sectional view 2704 of some embodiments corresponding to act 2808.

At 2810, an edge trimming process is performed on the multi-tier semiconductor structure. FIG. 26C illustrates a cross-sectional view 2604 of some embodiments corresponding to act 2810. FIG. 27C illustrates a cross-sectional view 2704 of some embodiments corresponding to act 2810.

At 2812, a dielectric protection layer is formed along sidewalls of the multi-tier semiconductor structure. FIG. 26D illustrates a cross-sectional view 2608 of some embodiments corresponding to act 2812. FIG. 27D illustrates a cross-sectional view 2708 of some embodiments corresponding to act 2812.

At 2814, a BTSV is formed through the dielectric protection layer. FIG. 26D illustrates a cross-sectional view 2608 of some embodiments corresponding to act 2814. FIG. 27D illustrates a cross-sectional view 2708 of some embodiments corresponding to act 2814.

In some embodiments, acts 2806-2814 may be repeated (along line 2816) to form a multi-dimensional chip having more than two stacked wafers. FIGS. 26E-26H illustrates cross-sectional views of some embodiments corresponding to a repeat of acts 2806-2814. FIGS. 27E-27H illustrates cross-sectional views of some embodiments corresponding to a repeat of acts 2806-2814.

At 2818, the multi-tier semiconductor structure is diced to form a plurality of multi-dimensional integrated chips.

Accordingly, in some embodiments, the present disclosure relates to method of reducing damage to one or more inter-level dielectric (ILD) layers overlying a substrate during an edge trimming process by forming a dielectric protection layer along sidewalls of the one or more ILD layers after the edge trimming process.

In some embodiments, the present disclosure relates to method of forming an integrated chip structure. The method includes forming a plurality of interconnect layers within a first interconnect structure disposed over an upper surface of a first semiconductor substrate; performing an edge trimming process to remove parts of the first interconnect structure and the first semiconductor substrate along a perimeter of the first semiconductor substrate, the edge trimming process resulting in the first semiconductor substrate having a recessed surface coupled to the upper surface by way of an interior sidewall disposed directly over the first semiconductor substrate; and forming a dielectric protection layer onto a sidewall of the first interconnect structure after performing the edge trimming process. In some embodiments, the method may further include bonding the first semiconductor substrate to a second semiconductor substrate; and reducing a thickness of the first semiconductor substrate after bonding the first semiconductor substrate to the second semiconductor substrate. In some embodiments, the dielectric protection layer is formed onto the sidewall of the first interconnect structure prior to reducing the thickness of the first semiconductor substrate. In some embodiments, the dielectric protection layer is formed onto the sidewall of the first interconnect structure after reducing the thickness of the first semiconductor substrate. In some embodiments, the method may further include performing a second edge trimming process on the second semiconductor substrate prior to bonding the first semiconductor substrate to the second semiconductor substrate. In some embodiments, the method may further include bonding a third semiconductor substrate to the second semiconductor substrate after forming the dielectric protection layer onto the sidewall of the first interconnect structure; performing a second edge trimming process on the third semiconductor substrate; and forming a second dielectric protection layer on the dielectric protection layer and onto sidewalls of the third semiconductor substrate. In some embodiments, the dielectric protection layer is directly between the first semiconductor substrate and the second semiconductor substrate. In some embodiments, the dielectric protection layer includes silicon nitride, silicon oxynitride, silicon carbide, silicon dioxide, hafnium dioxide, tantalum pentoxide, aluminum oxide, or zinc peroxide. In some embodiments, the dielectric protection layer has a thickness that is greater than or equal to approximately 200 Angstroms. In some embodiments, the edge trimming process damages one or more dielectric materials within the first interconnect structure resulting in recesses within a side of the one or more dielectric materials; and the dielectric protection layer is formed within the recesses. In some embodiments, the dielectric protection layer is deposited by way of a bevel deposition process. In some embodiments, the dielectric protection layer has a first thickness along the sidewall of the first interconnect structure that is between approximately 80% and approximately 100% of a second thickness of the dielectric protection layer directly over the first interconnect structure.

In other embodiments, the present disclosure relates to method of forming a multi-dimensional integrated chip. The method includes forming a plurality of interconnect layers within a dielectric structure over an upper surface of a first substrate; bonding the first substrate to a second substrate, wherein the dielectric structure is between the first substrate and the second substrate after bonding; performing an edge trimming process that removes parts of the dielectric structure and the first substrate along a perimeter of the first substrate; and forming a dielectric protection layer along sidewalls of the dielectric structure and the first substrate after performing the edge trimming process. In some embodiments, the method may further include reducing a thickness of the first substrate, the dielectric protection layer formed onto the sidewall of the dielectric structure prior to reducing the thickness of the first substrate. In some embodiments, the method may further include performing a wet cleaning process after performing the edge trimming process; and performing an anneal process after performing the wet cleaning process and before forming the dielectric protection layer. In some embodiments, the method may further include reducing a thickness of the first substrate, the dielectric protection layer formed onto the sidewall of the dielectric structure after reducing the thickness of the first substrate. In some embodiments, the method may further include bonding a third substrate to the first substrate, the dielectric protection layer disposed directly between the first substrate and the third substrate.

In yet other embodiments, the present disclosure relates to an integrated chip structure. The integrated chip structure includes a first substrate having an upper surface within a central region and a recessed surface within a recessed region surrounding the central region, the recessed surface laterally extending from the central region to an outermost surface of the first substrate and vertically between the upper surface and a lower surface of the first substrate opposing the upper surface; a first plurality of interconnect layers disposed within a first dielectric structure on the upper surface; and a dielectric protection layer over the recessed surface and along a sidewall of the first dielectric structure and along a sidewall of the first substrate. In some embodiments, the dielectric protection layer has a first thickness along the sidewall of the first dielectric structure that is greater than or equal to approximately 80% of a second thickness of the dielectric protection layer over a top surface of the first dielectric structure. In some embodiments, the recessed surface laterally extends past an outermost sidewall of the dielectric protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
    a first substrate having an upper surface and a recessed surface extending in a closed loop around the upper surface, wherein the recessed surface is vertically between the upper surface and a lower surface of the first substrate opposing the upper surface;
    a first plurality of interconnects disposed within a first dielectric structure on the upper surface; and
    a dielectric protection layer over the recessed surface, along a sidewall of the first dielectric structure, and along a sidewall of the first substrate, wherein the first substrate extends from directly below the dielectric protection layer to laterally outside of the dielectric protection layer.

2. The integrated chip structure of claim 1, wherein a bottommost surface of the dielectric protection layer rests on the recessed surface of the first substrate.

3. The integrated chip structure of claim 1, wherein the sidewall of the first dielectric structure is a first outermost sidewall of the first dielectric structure, the dielectric protection layer continuously extending from along the first outermost sidewall of the first dielectric structure to along an opposing second outermost sidewall of the first dielectric structure.

4. The integrated chip structure of claim 1, wherein the first substrate has a greater maximum width than the dielectric protection layer.

5. The integrated chip structure of claim 1, wherein the dielectric protection layer has a bottommost surface that is coupled to an interior sidewall of the dielectric protection layer that extends along the sidewall of the first dielectric structure.

6. The integrated chip structure of claim 1, wherein the first substrate continuously and vertically extends from directly between interior sidewalls of the dielectric protection layer to below a bottommost surface of the dielectric protection layer.

7. The integrated chip structure of claim 1, further comprising:
    a second substrate;
    a second plurality of interconnects disposed within a second dielectric structure on the second substrate; and
    a second dielectric protection layer disposed along a sidewall of the second dielectric structure and directly between the first substrate and the second substrate.

8. The integrated chip structure of claim 1, further comprising:
    a second substrate;
    a second plurality of interconnects disposed within a second dielectric structure on the second substrate; and
    a second dielectric protection layer continuously extending from along a sidewall of the dielectric protection layer to along a sidewall of the second substrate.

9. An integrated chip structure, comprising:
    a first substrate;
    a first interconnect structure on the first substrate, wherein the first interconnect structure comprises a first plurality of interconnects disposed within a first dielectric structure;
    a dielectric protection layer along a sidewall of the first interconnect structure and along a sidewall of the first substrate;
    a second substrate coupled to the first substrate; and
    wherein the dielectric protection layer is directly between the first substrate and the second substrate.

10. The integrated chip structure of claim 9, wherein the dielectric protection layer comprises an exterior sidewall facing away from the first substrate and a horizontally extending surface protruding outward from the exterior sidewall.

11. The integrated chip structure of claim 9, wherein both the first dielectric structure and the dielectric protection layer are directly between the first substrate and the second substrate.

12. The integrated chip structure of claim 9,
    wherein the first substrate comprises an upper surface and a recessed surface, the recessed surface extending in a closed loop around the upper surface; and
    wherein the recessed surface is vertically between the upper surface and a lower surface of the first substrate opposing the upper surface.

13. The integrated chip structure of claim 9, further comprising:
    a second dielectric protection layer arranged along a sidewall of the second substrate.

14. The integrated chip structure of claim 13, wherein the second dielectric protection layer further extends along an exterior sidewall of the dielectric protection layer.

15. An integrated chip structure, comprising:
    a first substrate having an upper surface and a recessed surface, the recessed surface surrounding the upper surface as viewed in a plan-view, wherein the recessed surface is vertically between the upper surface and a lower surface of the first substrate opposing the upper surface;

a first plurality of interconnects disposed within a first dielectric structure on the upper surface; and a dielectric protection layer disposed along a sidewall of the first dielectric structure and along a sidewall of the first substrate, wherein the dielectric protection layer has a horizontally extending surface that faces away from the first substrate and that is vertically between the upper surface and the recessed surface.

16. The integrated chip structure of claim 15, wherein the horizontally extending surface is coupled to an outermost sidewall of the dielectric protection layer.

17. The integrated chip structure of claim 15, wherein the dielectric protection layer comprises silicon nitride, silicon oxynitride, silicon carbide, silicon dioxide, hafnium dioxide, tantalum pentoxide, aluminum oxide, or zinc peroxide.

18. The integrated chip structure of claim 15, further comprising:

a second substrate;

a second plurality of interconnects disposed within a second dielectric structure on the second substrate, the first dielectric structure and the second dielectric structure being between the first substrate and the second substrate, wherein the dielectric protection layer extends over the second substrate; and a through-substrate via (TSV) electrically coupled to one or more of the first plurality of interconnects and the second plurality of interconnects, wherein the TSV extends through both the second substrate and the dielectric protection layer.

19. The integrated chip structure of claim 15, wherein a bottommost surface of the dielectric protection layer is directly above the recessed surface.

20. The integrated chip structure of claim 15, wherein a bottommost surface of the dielectric protection layer physically contacts the recessed surface.

* * * * *